United States Patent [19]
Mizutani

[11] Patent Number: 5,728,605
[45] Date of Patent: Mar. 17, 1998

[54] METHOD FOR PRODUCING AN OPTICAL SEMICONDUCTOR DEVICE HAVING A CARRIER INJECTION PATH OR AN ELECTRIC-FIELD APPLYING PATH

[75] Inventor: Natsuhiko Mizutani, Yokohama, Japan

[73] Assignee: Canon Kabushiki Kaisha, Tokyo, Japan

[21] Appl. No.: 772,061

[22] Filed: Dec. 19, 1996

Related U.S. Application Data

[63] Continuation of Ser. No. 579,917, Dec. 28, 1995, abandoned, which is a continuation of Ser. No. 368,592, Jan. 4, 1995, abandoned.

[30] Foreign Application Priority Data

Jan. 18, 1994 [JP] Japan .................... 6-017814

[51] Int. Cl.$^6$ ............................. H01L 21/00
[52] U.S. Cl. .................. 438/41; 438/43; 438/44; 438/45; 438/47; 438/915; 372/45
[58] Field of Search ................. 437/126, 129, 437/133, 951; 372/45; 148/DIG. 2; 438/43, 44, 45, 47, 915

[56] References Cited

U.S. PATENT DOCUMENTS

| | | | |
|---|---|---|---|
| 4,032,033 | 6/1977 | Chu et al. | 228/200 |
| 4,785,457 | 11/1988 | Asbeck et al. | 372/45 |
| 4,839,307 | 6/1989 | Koichi et al. | 437/129 |
| 4,932,033 | 6/1990 | Seiichi et al. | 372/46 |
| 5,155,560 | 10/1992 | Sheperd | 357/17 |

(List continued on next page.)

FOREIGN PATENT DOCUMENTS

| | | | |
|---|---|---|---|
| 0261262 | 3/1988 | European Pat. Off. | H01S 3/19 |
| 0526083 | 2/1993 | European Pat. Off. | H01S 3/19 |
| 6181362 | 12/1992 | Japan | H01S 3/18 |

OTHER PUBLICATIONS

Patents Abstracts of Japan, vol. 011 No. 127 (E-501), Apr. 21, 1987 & JP-A-61 270886 (Mitsubishi Electric Corp) Dec. 1, 1986.

T. Wolf et al., "Tunable twin-guide (TTG) laser diodes with metal-clad ridge-waveguide (MCRW) structure for coherent optical communications", *European Transactions on Telecommunications and Related Technologies*, vol. 3, No. 5, 1992, pp. 517-522.

(List continued on next page.)

*Primary Examiner*—Charles L. Bowers, Jr.
*Attorney, Agent, or Firm*—Fitzpatrick, Cella, Harper & Scinto

[57] ABSTRACT

An optical semiconductor device includes a plurality of electrodes formed on a common side of a substrate. On the substrate, a first type conductivity layer, a first main layer such as an active layer, which has any one of an undoped type, a first type conductivity and a second type conductivity, and a second type conductivity layer are formed in this order. The layers down to at least the second type conductivity layer are removed to form a ridge and at least one contact groove, which reaches the first type conductivity layer, is formed, such that surfaces having different surface indices from a surface index of the substrate are exposed at the ridge and the contact groove. A regrowth is performed on the exposed surfaces using an amphiconductivity impurity as a dopant, such that a first portion having a first type conductivity is grown on the contact groove and a second portion having a second type conductivity is grown on the ridge. At least one transverse pn reverse junction portion is also formed during the regrowth performing step. The first type conductivity layer and the first portion act as a current injection path or first means for applying an electric field to the first main layer, and the second type conductivity layer and the second portion act as another current injection path or second means for applying an electric field to the first main layer which cooperates with the first means.

34 Claims, 14 Drawing Sheets

U.S. PATENT DOCUMENTS

| | | | |
|---|---|---|---|
| 5,222,087 | 6/1993 | Thulke et al. | 372/45 |
| 5,284,791 | 2/1994 | Sakata et al. | 437/129 |
| 5,333,141 | 7/1994 | Wolf et al. | 372/46 |

OTHER PUBLICATIONS

Patent Abstracts of Japan, vol. 016, No. 307 (E–1229) Jul. 7, 1992 & JP–A–0484484.

W.I. Wang, et al., "Crystal orientation dpendence of silicon doping in molecular beam epitaxial AlGaAs/GaAs heterostructures," Appl. Phys. Lett. 47 (8), pp. 826–828 (1985).

M.–C. Amann, et al., "Tunable twin–guide laser: A novel laser diode with improved tuning performance", Appl. Phys. Lett. 54 (25), pp. 2352–2353 (1989).

n TYPE p TYPE

FIG.4A
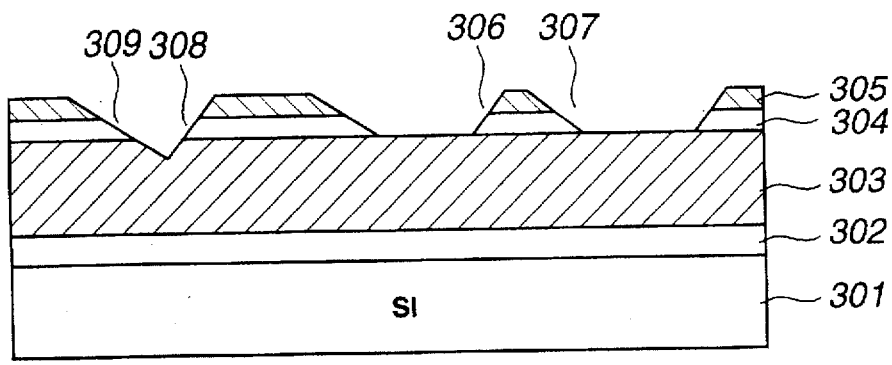
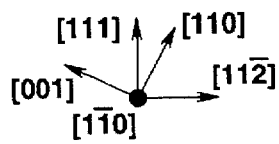
FIG.4B
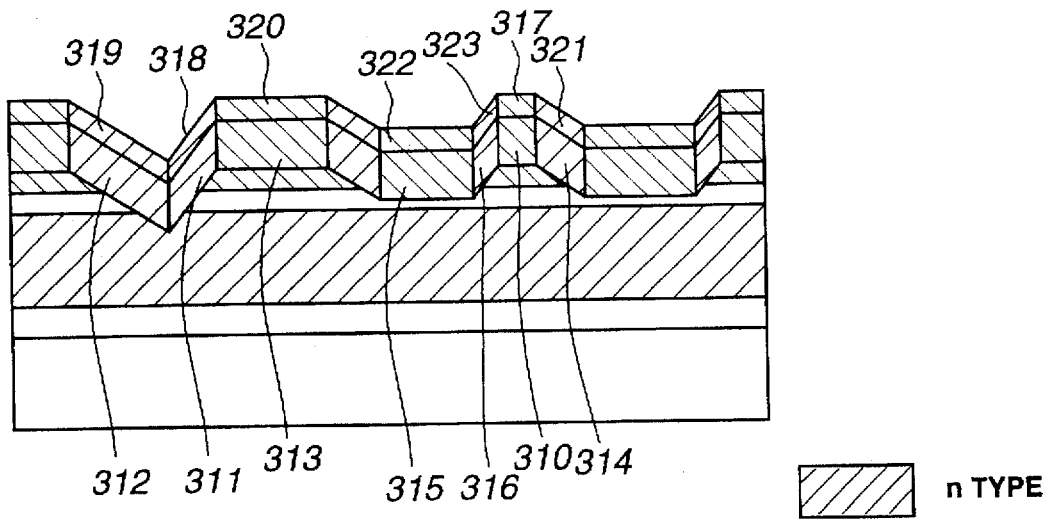
n TYPE
p TYPE
FIG.4C
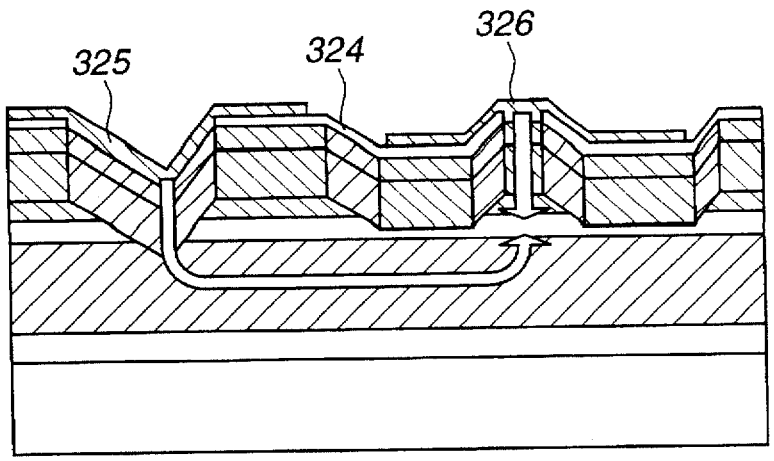

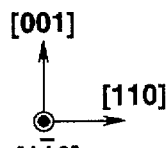
FIG. 6A
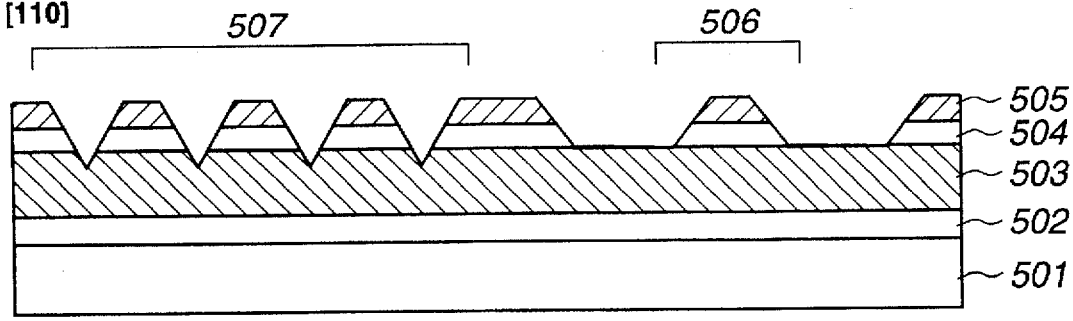
FIG. 6B
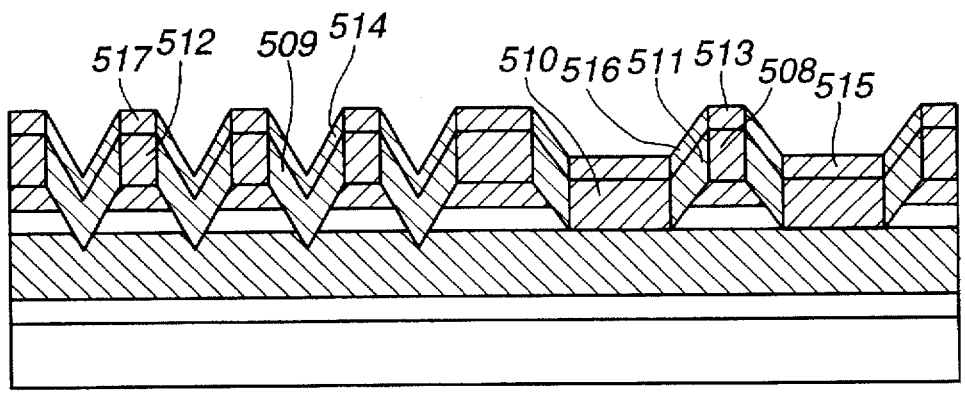
FIG. 6C
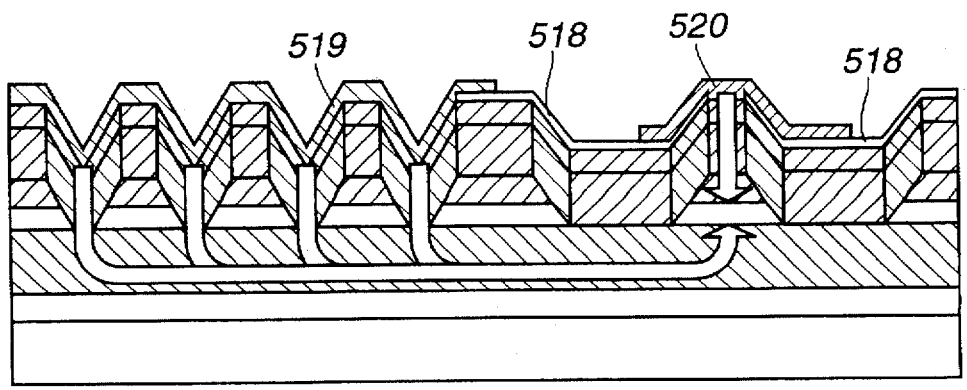
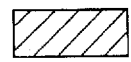 n TYPE
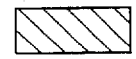 p TYPE

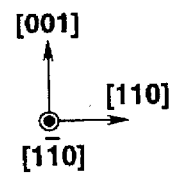
FIG.7A
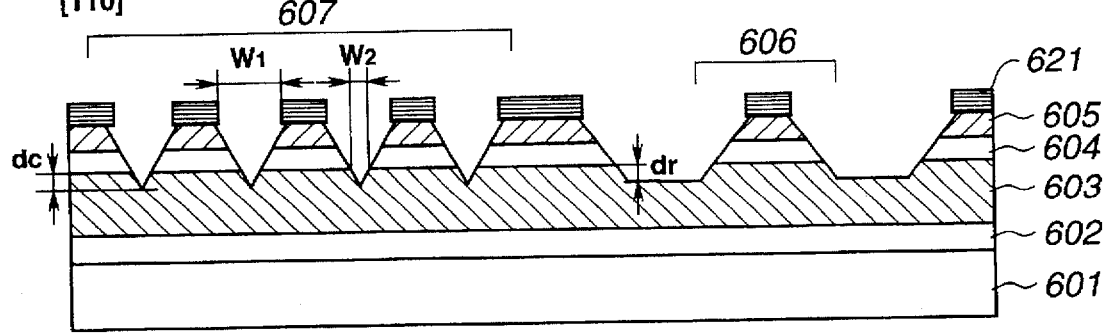
FIG.7B
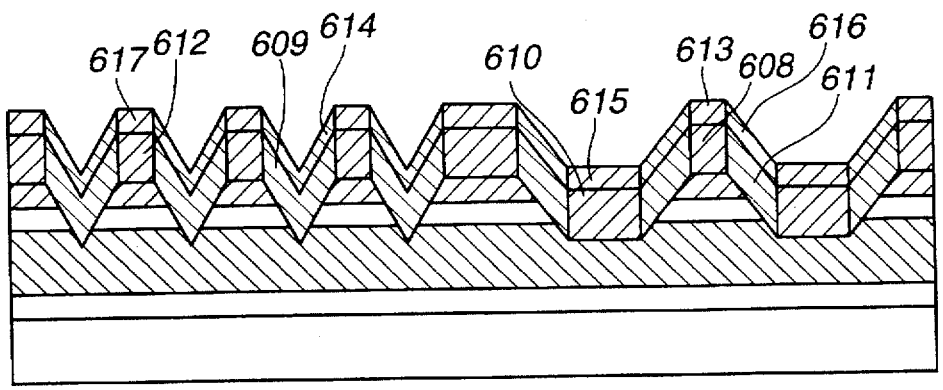
FIG.7C
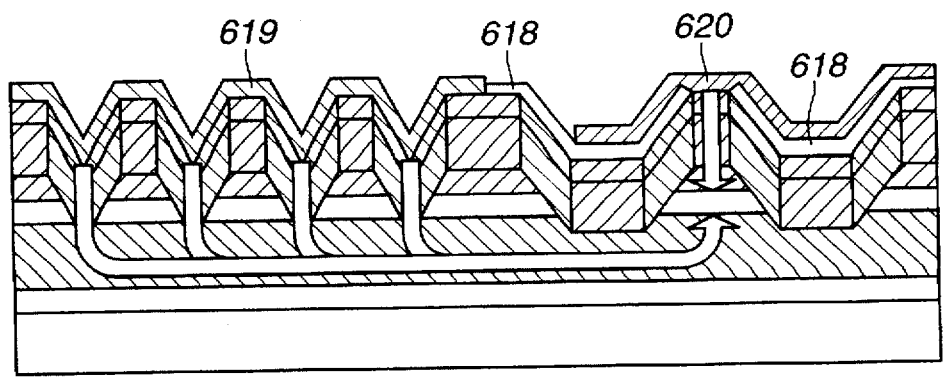

FIG. 9A
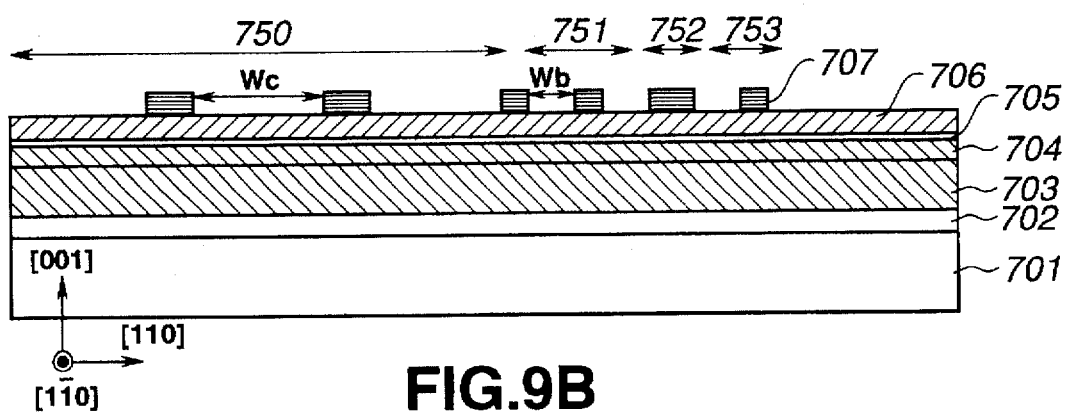
FIG. 9B
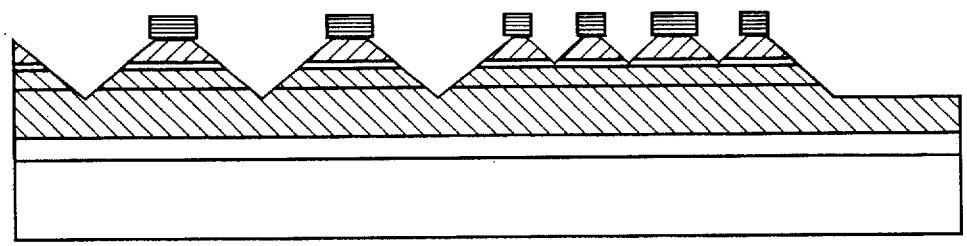
FIG. 9C
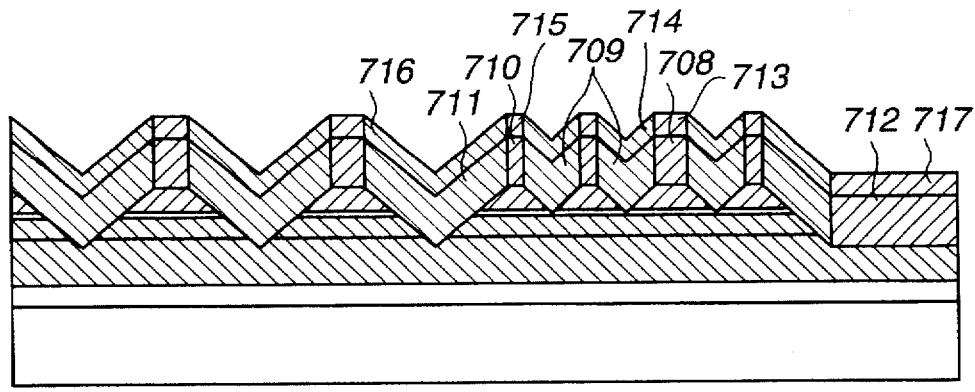
FIG. 9D
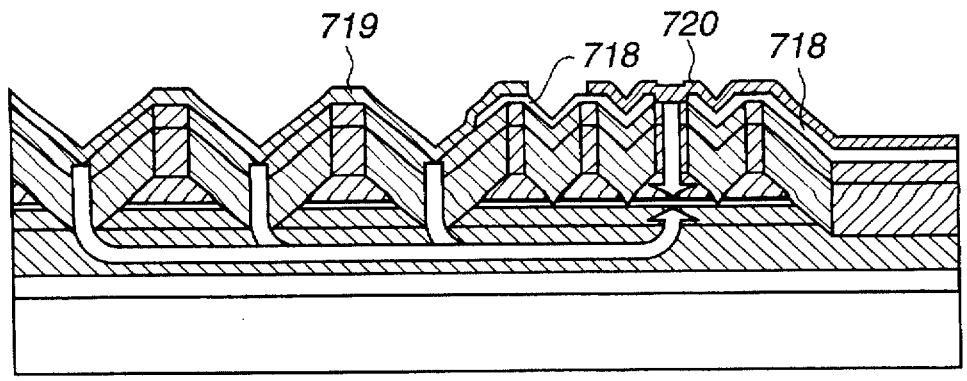
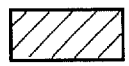 n TYPE 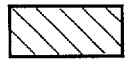 p TYPE

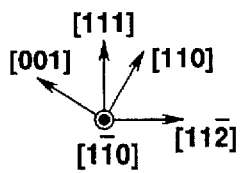
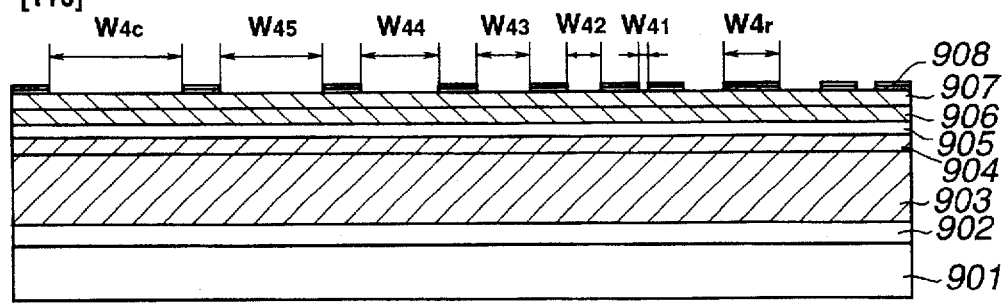
FIG.12A
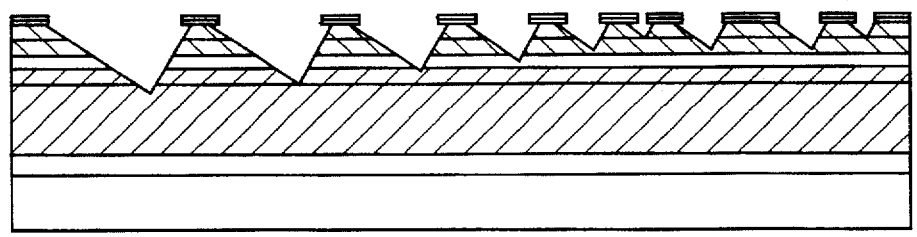
FIG.12B
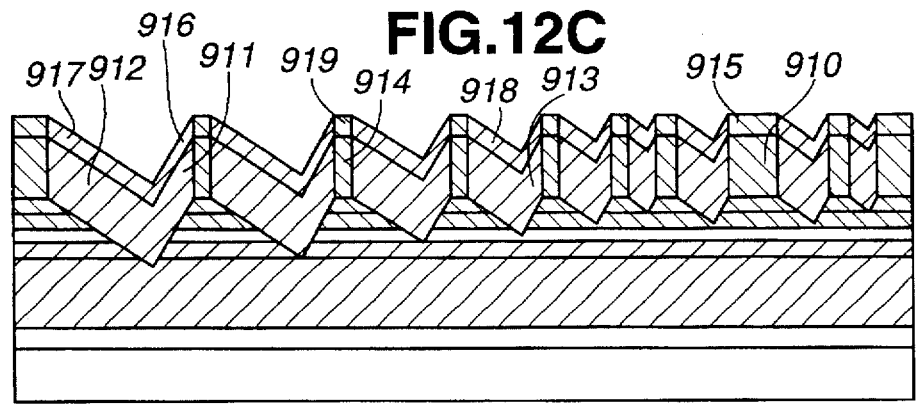
FIG.12C
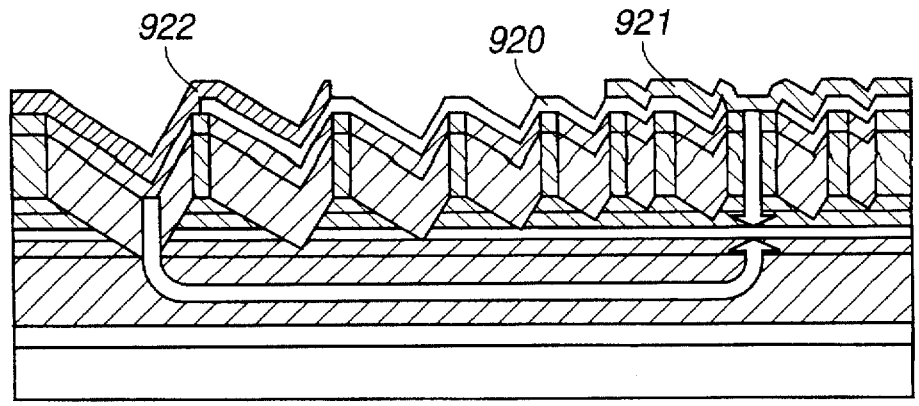
FIG.12D

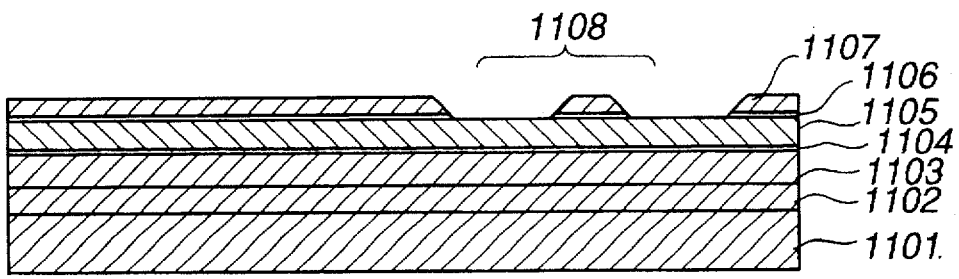
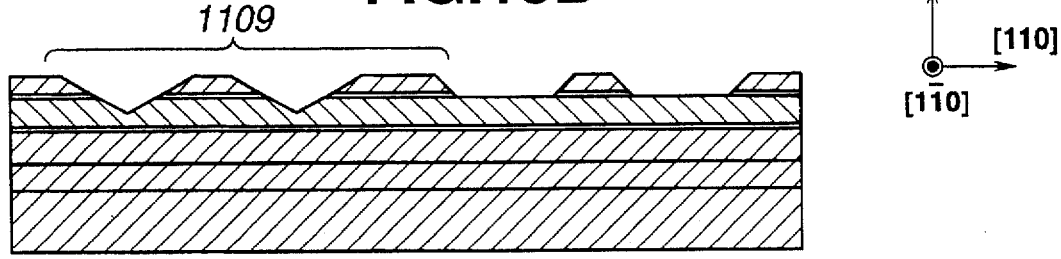
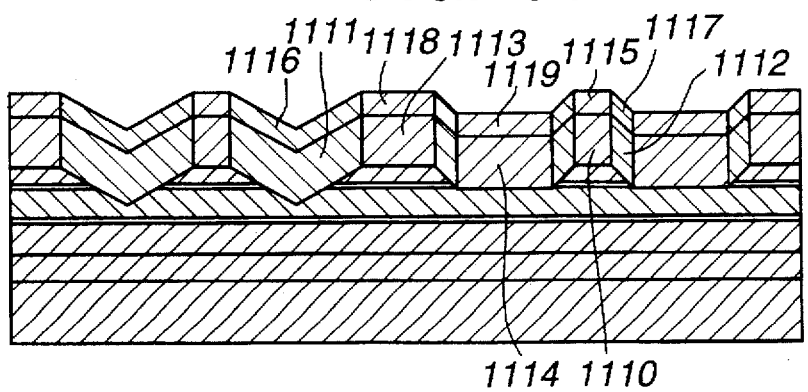
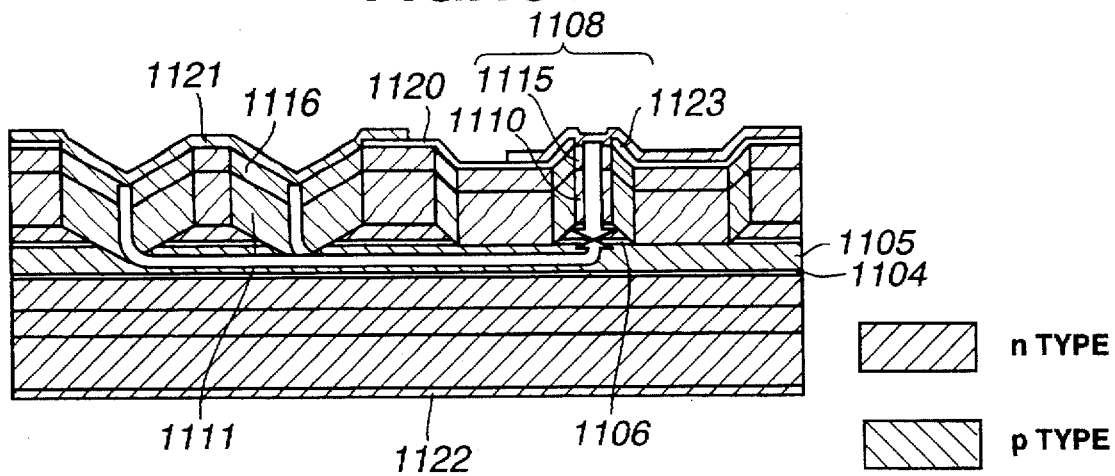

METHOD FOR PRODUCING AN OPTICAL SEMICONDUCTOR DEVICE HAVING A CARRIER INJECTION PATH OR AN ELECTRIC-FIELD APPLYING PATH

This application is a continuation of application Ser. No. 08/579,917 filed Dec. 28, 1995, now abandoned which is a continuation application of Ser. No. 08/368,592 filed Jan. 4, 1995, abandoned.

BACKGROUND OF THE INVENTION

1. Field of the Invention

The present invention relates to an optical semiconductor device for use in optical communications, optical commutation, optical recording, optical operation, optical measurement and the like. The present invention relates, in particular, to a planar-structure device provided with p-type and n-type electrodes formed on a common side of its substrate, a method of producing the planar-structure device, a device in which injection of a current and application of an electric field can be independently performed and a method of producing such a device.

2. Related Background Art

A planar semiconductor laser, which is operated by a current injection in a transverse or lateral direction as shown in FIG. 1, is conventionally known. In a structure as shown in FIG. 1, a high-resistance AlGaAs lower clad layer 2, a GaAs/AlGaAs active layer 3 of a multiple quantum well structure, a a high-resistance AlGaAs upper clad layer 4, and a GaAs contact layer 5 are successively layered on a semi-insulating GaAs substrate 1, in this order. After a p-type impurity diffused region 6 and an n-type impurity diffused region 7 are formed by diffusion, a p-type electrode 8 and an n-type electrode 9 are deposited.

The operation of that device will now be described. The multiple quantum well structure active layer 3 is mixed or disordered in the p-type and n-type impurity diffused regions 6 and 7, and AlGaAs layers having an averaged composition are respectively formed thereat. Holes injected through the p-type electrode 8 flow from the p-type impurity diffused region 6 into the non-disordered multiple quantum well structure active layer 3. In a similar manner, electrons injected through the n-type electrode 9 flow from the n-type impurity diffused region 7 into the non-disordered multiple quantum well structure active layer 3. The averaged composition of AlAs of the disordered multiple quantum well structure layer is lower than that of the AlGaAs upper and lower clad layers 4 and 2, so that injected carriers can be effectively injected into the active layer 3. Thus, population inversion occurs in the active layer 3 and the laser oscillation is caused.

Since the semi-insulating substrate 1 is used and therefore a semiconductor laser is made without interference from a driving current between a plurality of devices according to FIG. 1, this device is suited to an optical integrated circuit.

Further, a tunable twin-guide (TTG) laser having a modulating layer formed independently from an active layer has been proposed as a easy-controllable tunable laser that can be used in optical communications, optical commutation and the like (see M. C. Amann, S. Illek, C. Schanen and W. Thulke, Applied Physics Letters, vol. 54, pp. 2532–2533 (1989)). The structure of this device is as follows: As shown in FIG. 2, on a p$^+$-type InP substrate 101, a p-type InP buffer layer 102, a p-type InGaAsP lower clad layer 103, an intrinsic (i-) InGaAsP active layer 104, an n-type InP separating layer 105, an i-InGaAsP modulating layer 106, and a p-type InP upper clad layer 107 are successively layered in this order. After that, a ridge reaching the p-type InP buffer layer 102 is formed. Surroundings of the ridge is filled with an n-type InP burying layer 108, and an SiO$_2$ layer 109 is deposited. After openings are formed in the SiO$_2$ layer 109, p-type electrodes 110 and 111 are respectively formed on the ridge and a bottom surface of the substrate 101. Further, an n-type electrode 112 is formed by the ridge.

In this structure, holes are injected into the active layer 104 through the p-type lower electrode 111, the p-type substrate 101, the p-type buffer layer 102 and the p-type lower clad layer 103, while electrons are injected into the active layer 104 through the n-type upper electrode 112, the n-type burying layer 108 and the n-type separating layer 105. Thus, population inversion is established in the active layer 104 and the laser oscillation is caused.

On the other hand, independently from the current injection into the active layer 104, holes are injected into the modulating layer 106 through the p-type upper electrode 110 and the p-type upper clad layer 107, while electrons are injected into the modulating layer 106 through the n-type upper electrode 112, the n-type burying layer 108 and the n-type separating layer 105. Hence, the refractive index of the modulating layer 106 is modulated and the propagation constant of a waveguide is modulated. Thus, the wavelength of laser oscillation is modulated. Such a tunable laser is disclosed in the above-mentioned reference.

However, a diffusion process is needed in fabricating a conventional semiconductor laser constructed as shown in FIG. 1, so the process for fabricating such an integrated device is limited. In more detail, a heat treatment or thermal process above ca. 850° C. is needed when an n-type impurity diffused region is formed. Such a process is undesirable to an InP series device because it is vulnerable to heat. Further, a sharp profile cannot be obtained due to diffusion, and the process cannot be used to fabricate a modulator or the like where an electric field is applied across an active layer.

In a TTG laser as shown in FIG. 2, current leaks exist through a pn junction between p-type buffer layer 102 and n-type burying layer 108 and a pn junction between p-type upper clad layer 107 and n-type burying layer 108. Undesirable heat is generated thereby. Such heat generation acts to reduce the refractive index modulation due to carriers, and the threshold of a device is raised.

SUMMARY OF THE INVENTION

It is an object of the present invention to provide an optical semiconductor device provided with a plurality of electrodes formed on a common side of a substrate without using a heat treatment or thermal processing step, and a method of producing this device.

Further, it is another object of the present invention to provide a two-layer light guide structure device in which a path of leak current is narrowed with a transverse confinement structure for light being attained, by using a burying structure for a ridge, and a method of fabricating this device.

The object of the present invention is achieved by an optical semiconductor device which comprises a substrate, a first portion having a first type conductivity, a second portion having a second type conductivity, a first main layer sandwiched between a first type conductivity layer and a second type conductivity layer, and at least one transverse pn reverse junction portion. The first portion is formed on one side of the substrate, and a second portion is formed on the same side of the substrate as the first portion. The first type conductivity layer and the first portion act as one of a first injection path of either electrons or holes and first means for applying an electric field to the first main layer, and the second type conductivity layer and the second portion act as one of a second injection path of the remaining electrons or holes and second means for applying an electric field to the first main layer which cooperates with the first means to apply the electric field across the first main layer. The at least one transverse pn reverse junction portion electrically separates one of the first injection path and the first means from one of the second injection path and the second means.

Further, the object of the present invention is achieved by an optical semiconductor device which comprises a conductive substrate, a lower clad layer having a first type conductivity, a first light guide layer having any one of 1) an undoped type, 2) a first type conductivity, and 3) a second type conductivity, a separating layer having a second type conductivity, a second light guide layer having any one of 1) an undoped type, 2) a first type conductivity, and 3) a second type conductivity, an upper clad layer having a first type conductivity, and first, second and third electrodes which are respectively provided for the upper clad layer. The separating layer and the lower clad layer are such that either an electric field application or a current injection can be independently performed to the first light guide layer and the second light guide layer. The lower clad layer is formed on one side of the substrate, and the first light guide layer is formed on the lower clad layer. The separating layer is formed on the first light guide layer. The second light guide layer is formed on the separating layer and is electrically separated from the first light guide layer by the separating layer. The upper clad layer is formed on the second light guide layer.

Further, the object of the present invention is achieved by a method for producing an optical semiconductor device which comprises a step of forming a first type conductivity layer, a first main layer, which has any one of an undoped type, a first type conductivity and a second type conductivity, and a second type conductivity layer on a substrate in this order; a step of removing the layers down to at least the second type conductivity layer to form a ridge and forming at least one contact groove, which reaches the first type conductivity layer, such that surfaces having surface indices different from a surface index of the substrate are exposed at the ridge and the contact groove; a step of performing a regrowth on the exposed surfaces using an amphi-conductivity impurity as a dopant, such that a first portion having a first type conductivity is grown on the contact groove and a second portion having a second type conductivity is grown on the ridge; and a step of forming at least one transverse pn reverse junction portion during the regrowth performing step. The first type conductivity layer and the first portion act as one of a first injection path for electrons or holes and first means for applying an electric field to the first main layer, and the second type conductivity layer and the second portion act as one of a second injection path of the remaining electrons or holes and second means for applying an electric field to the first main layer which cooperates with the first means to apply the electric field across the first main layer. The transverse pn reverse junction portion electrically separates one of the first injection path and the first means from one of the second injection path and the second means.

These advantages and others will be more readily understood in connection with the following detailed description of the preferred embodiments in conjunction with the drawings.

BRIEF DESCRIPTION OF THE DRAWINGS

FIGS. 4A–4C are respectively cross-sectional views illustrating steps for fabricating a second embodiment of the present invention.

FIGS. 6A–6C are respectively cross-sectional views illustrating steps for fabricating a fourth embodiment of the present invention.

FIGS. 7A–7C are respectively cross-sectional views illustrating steps for fabricating a fifth embodiment of the present invention.

FIGS. 9A–9D are respectively cross-sectional views illustrating steps for fabricating a sixth embodiment of the present invention.

FIGS. 12A–12D are respectively cross-sectional views illustrating steps for fabricating an eighth embodiment of the present invention.

FIGS. 13A–13D are respectively cross-sectional views illustrating steps for fabricating a ninth embodiment of the present invention.

DESCRIPTION OF THE PREFERRED EMBODIMENTS

First embodiment

Embodiments of the present invention will be hereinafter described with reference to the figures.

A first embodiment of the present invention will be described with reference to FIGS. 3A–3C. The first embodiment is directed to a semiconductor laser provided with p-type and n-type electrodes on a common side of a semi-insulating substrate without using a diffusion process.

Before describing the structure of this embodiment, doping of Si into GaAs or AlGaAs will be described. Si of a Group IV element is an amphi-conductivity impurity for a Group III–V compound semiconductor. Si will become an n-type impurity when Si occupies a Group III site during crystal growth, while Si will become a p-type impurity when Si occupies a Group V site. In more detail, Si will occupy a Group V site and become a p-type impurity when an exposed surface during crystal growth is stabilized for Group III, while Si will occupy a Group III site and become an n-type impurity when an exposed surface during crystal growth is stabilized for Group V. As a cut surface of a (001)

oriented GaAs wafer is inclined from a (001) surface about an axis extending in a [1$\bar{1}$0] direction, a {n11}A surface or a crystal surface of a higher-order index will appear. A Group III stabilized surface is easy to form between a {311}A surface having an inclination angle of about 25 degrees from a {001} surface and a {111}A surface having an inclination angle of about 54 degrees from a {001} surface, and an Si-doped layer formed thereon is likely to be p-type (see Japanese Patent Application No. 4-353566 and W. I. Wang, E. E. Mendez, T. S. Kuan and L. Esaki, Applied Physics Letters, vol. 47, pp. 826–828 (1985)). In this reference, it is reported that the activation rate of a p-type Si-doped layer is reduced to ¼ to ⅕ on, especially, {211}A and {311}A surfaces.

Consider that an orientation of a substrate surface will be inclined from a {111}A surface about a [1$\bar{1}$0] axis. Since a {111}A surface does not have a second rank symmetry, it is necessary to divide into two cases where the surface is inclined toward [110] and [001] directions, respectively. When inclined toward the [110] direction, the Group III stabilized surface becomes hard to form, and Si occupies a Group III site and becomes an n-type impurity near a {110} surface which is inclined about 25 degrees, or more inclined surface. As inclined toward the [001] direction, a {n11}A crystal surface appears and then a {001} surface appears. Si occupies a Group III site and becomes an n-type impurity between a {311}A surface having an inclination angle of about 30 degrees and a {001} surface having an inclination angle of about 54 degrees. Thus, Si occupies a Group III site between a surface having an inclination angle of about 25 degrees from a {111} surface and a surface having an inclination angle of about 54 degrees from a {111} surface. A {114} surface has an inclination angle of about 34 degrees from a {111} surface.

Figure 1:
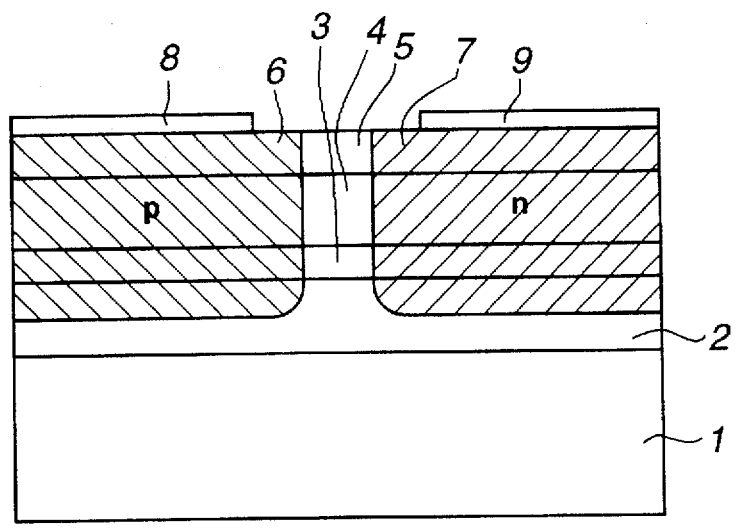
FIG. 1 illustrates a prior art transverse current injection type semiconductor laser.
Figure 2:
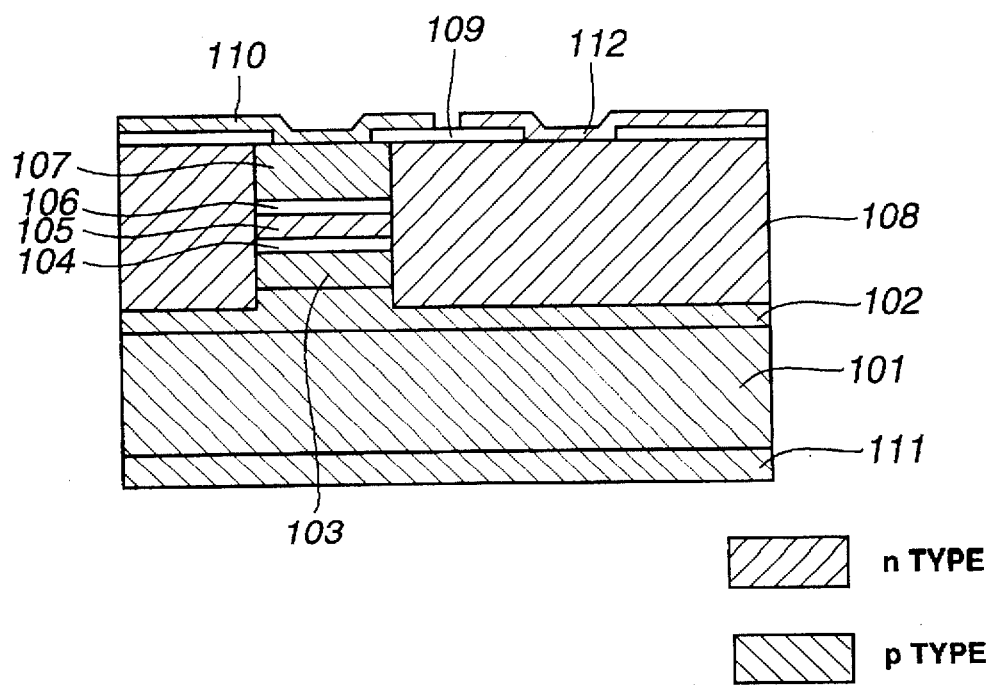
FIG. 2 illustrates a prior art TTG semiconductor laser.
Figure 3A:
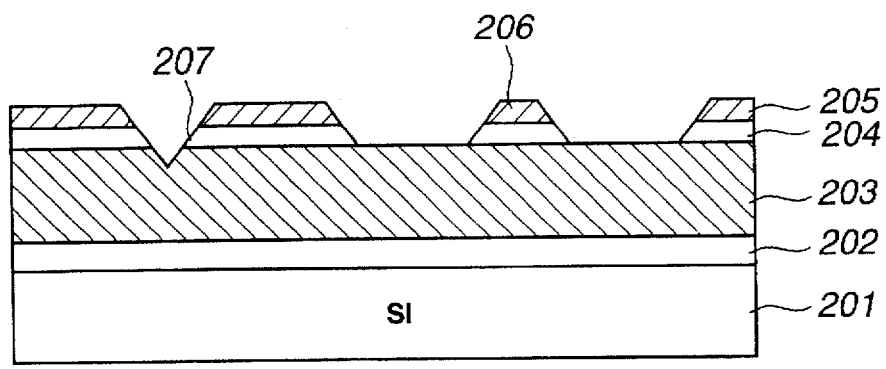
FIGS. 3A–3C are respectively cross-sectional views illustrating steps for fabricating a first embodiment of the present invention.

In the first embodiment, as shown in FIG. 3A, on a semi-insulating GaAs (001) substrate 201, an undoped GaAs buffer layer 202, a p-type AlGaAs lower clad layer 203, an undoped GaAs/AlGaAs multiple quantum well structure active layer 204 and an n-type AlGaAs upper clad layer 205 are successively formed in this order.

Next, as shown in FIG. 3A, by performing a patterning by photolithography and a selective etching, layers down to the active layer 204 are removed and a ridge 206 reaching the p-type lower clad layer 203 is formed extending in a [1$\bar{1}$0] direction. At this time, formation of side surfaces of the ridge 206 is effected by a chemical dry etching method known as a reactive ion etching and a wet etching using an etchant of ammonia series, so that a {111}A surface is exposed.

A contact groove 207 reaching the p-type lower clad layer 203 is also formed by another patterning using photolithography and another etching. The groove 207 is formed by a wet etching using an etchant of sulphuric acid series, so that a {111}A surface is exposed.

Figure 3B:
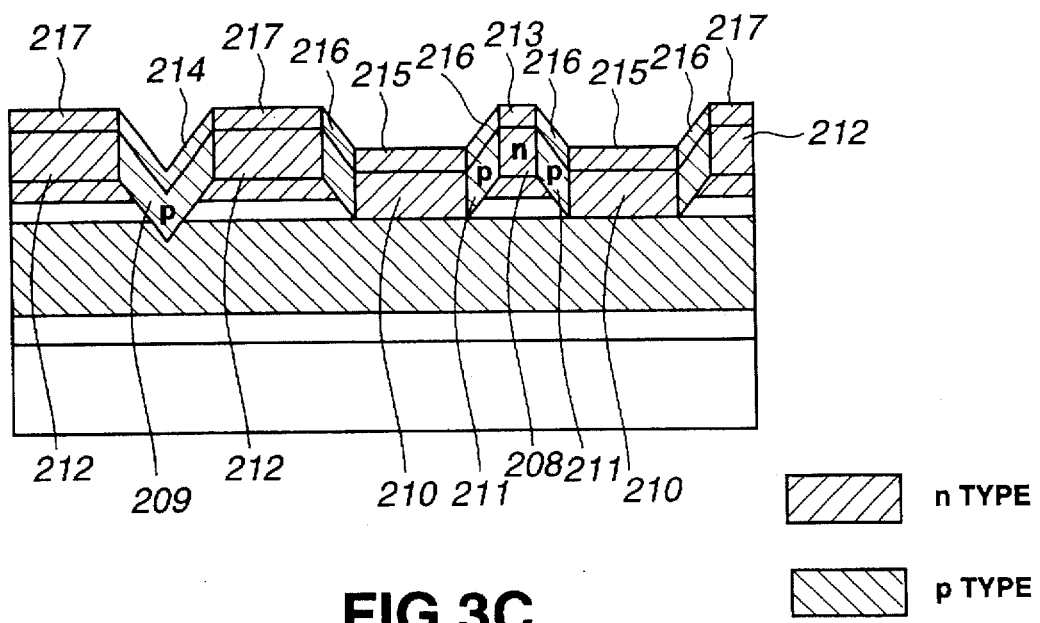

On the thus-formed wafer, as shown in FIG. 3B, AlGaAs layers 208, 209, 210, 211 and 212 and GaAs contact layers 213, 214, 215, 216 and 217 are again grown by a chemical beam epitaxy (CBE) method using Si as an amphi-conductivity impurity dopant. The AlGaAs layer 208 is an Si-doped AlGaAs layer grown on an n-type AlGaAs (001) surface of the upper clad layer 205 and exhibits an n-type conductivity (hatched portions in FIGS. 3A–3C). The Si-doped AlGaAs layer 209 grown on the {111}A surface of the groove 207, which extends from the p-type lower clad layer 203 to the upper clad layer 205 exhibits a p-type conductivity. The layer 211 is an Si-doped AlGaAs layer grown on the {111}A surface of a side surface of the ridge 206 and exhibits a p-type conductivity. This layer 211 performs a current confinement function for the ridge 206. The layer 212 is an Si-doped AlGaAs layer grown on a (001) surface of the upper clad layer 205 adjacent to the contact groove 207 and exhibits an n-type conductivity, similar to the layer 208. This layer 212 performs a current confinement function for the p-type AlGaAs layer 209. Further, the layer 210 is an Si-doped AlGaAs layer grown on a (001) surface of the bottom surface of an etched groove adjacent to the ridge 206 and exhibits an n-type conductivity.

Conductivity types of the GaAs layers 213, 214, 215, 216 and 217 are observed in the same manner. That is, the GaAs layer 214 at the contact groove 207 exhibits a p-type conductivity, and the GaAs layer 213 at an upper portion of the ridge 206 exhibits an n-type conductivity. The GaAs layer 215 on the bottom surface adjacent to the ridge 206 exhibits an n-type conductivity, the GaAs layer 216 on a slanting surface of the ridge 206 exhibits a p-type conductivity and the GaAs layer 217 on a (001) surface adjacent to the contact groove 207 exhibits an n-type conductivity.

Figure 3C:
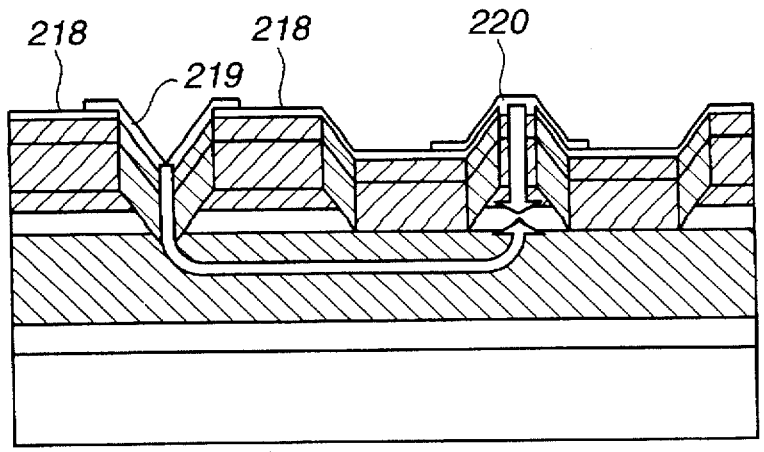

Then, as shown in FIG. 3C, an SiO$_2$ insulating layer 218 is formed, and after opening window portions, p-type electrode 219 and n-type electrode 220 are deposited. Ohmic contacts are formed by alloying those deposited electrodes 219 and 220.

The operation of this embodiment will be described below. Holes injected through the p-type contact layer 214 are supplied to a portion of the GaAs/AlGaAs multiple quantum well structure active layer 204 right below the ridge 206, via the p-type AlGaAs layer 209 and the p-type AlGaAs lower clad layer 203. Electrons injected through the n-type contact layer 213 on the ridge 206 are supplied to the active layer 204 via the n-type AlGaAs layer 208 and the n-type AlGaAs upper clad layer 205. Thus, population inversion due to such current injection is observed in the active layer 204, and the laser oscillation is caused.

In the foregoing, (001) surface, (111) surface and ($\bar{1}\bar{1}$1) surface are used by forming the ridge 206 on the (001) surface extending in the [1$\bar{1}$0] direction, but the surface of the substrate 201 may be its crystallographical equivalent surface, such as (100) surface, (010) surface and ($\bar{1}$00) surface, for a {111}A surface only needs to be used.

Furthermore, the above device can be modified by varying the band gap of the active layer 204 with the same layer structure being used. In this case, a reverse bias voltage is applied across the device, and a device acts as a modulator or a waveguide type PIN detector, due to quantum confinement Stark effect (QCSE) and the like.

Second embodiment

FIGS. 4A–4C show a second embodiment of the present invention. As shown in FIG. 4A, on a semi-insulating GaAs (111)A substrate 301, an undoped GaAs buffer layer 302, an n-type AlGaAs lower clad layer 303, an undoped GaAs/AlGaAs multiple quantum well structure active layer 304 and a p-type AlGaAs upper clad layer 305 are formed in this order. Next, as shown in FIG. 4A, by using a patterning by photolithography and a selective etching, layers halfway down to the active layer 304 are removed, and a ridge portion between two slanting surfaces 306 and 307 and a contact groove between slanting surfaces 308 and 309 reaching the n-type lower clad layer 303 are formed in a [1$\bar{1}$0] direction. Here, the slanting surfaces 306 and 308 respectively have a (001) surface orientation or a surface orientation near (001), and the slanting surfaces 307 and 309 respectively have a (110) surface orientation or a surface orientation near (110).

On the thus-formed wafer, as shown in FIG. 4B, AlGaAs burying layers 310, 311, 312, 313, 314, 315 and 316 and GaAs contact layers 317, 318, 319, 320, 321, 322 and 323 are regrown by the CBE using Si as an amphi-conductivity impurity dopant.

The AlGaAs layer 310 grown on the ridge is an Si-doped AlGaAs layer grown on a {111}A surface of the upper clad layer 305 and exhibits a p-type conductivity. The Si-doped AlGaAs layers 311 and 312 grown on the contact groove are respectively grown on (001) and (110) surfaces of the lower clad layer 303, the active layer 304 and the upper clad layer 305, and exhibit an n-type conductivity (hatched portions in FIGS. 4A–4C).

The Si-doped AlGaAs layers 314 and 316 grown on the slanting surfaces 306 and 307 of the ridge portion are grown on (110) and (001) surfaces of the active layer 304 and the upper clad layer 305, and exhibit an n-type conductivity. Those layers 314 and 316 act as a current confinement function layer for the ridge. The Si-doped AlGaAs layer 313 grown on a (111) surface of the upper clad layer 305 adjacent to the contact groove exhibits a p-type conductivity. This layer 313 performs a current confinement function for the n-type AlGaAs layers 311 and 312. Further, the Si-doped AlGaAs layer 315 grown on a (001) surface of the active layer 304 also exhibits a p-type conductivity.

Conductivity types of the GaAs layers 317, 318, 319, 320, 321, 322 and 323 are observed in the same manner. That is, the GaAs layers 317, 320 and 322 exhibit a p-type conductivity, and the GaAs layers 318, 319, 321 and 323 exhibit an n-type conductivity.

Then, as shown in FIG. 4C, an $SiO_2$ insulating layer 324 is formed, and after opening window portions, n-type electrode 325 and p-type electrode 326 are deposited. Ohmic contacts are formed by alloying those deposited electrodes 325 and 326.

The operation of this embodiment will be described below. Holes injected through the p-type electrode 326 are supplied to the active layer 304, via the p-type GaAs layer 317, the p-type AlGaAs layer 310 and the p-type upper clad layer 305. Electrons injected through the n-type electrode 325 are supplied to the active layer 304, via the n-type GaAs layers 318 and 319, the n-type AlGaAs layers 311 and 312 and the n-type lower clad layer 303 and via the n-type AlGaAs layer 311. Thus, population inversion due to such current injection is observed in the active layer 304, and laser oscillation is caused, similar to the first embodiment.

Third embodiment

Figure 5:
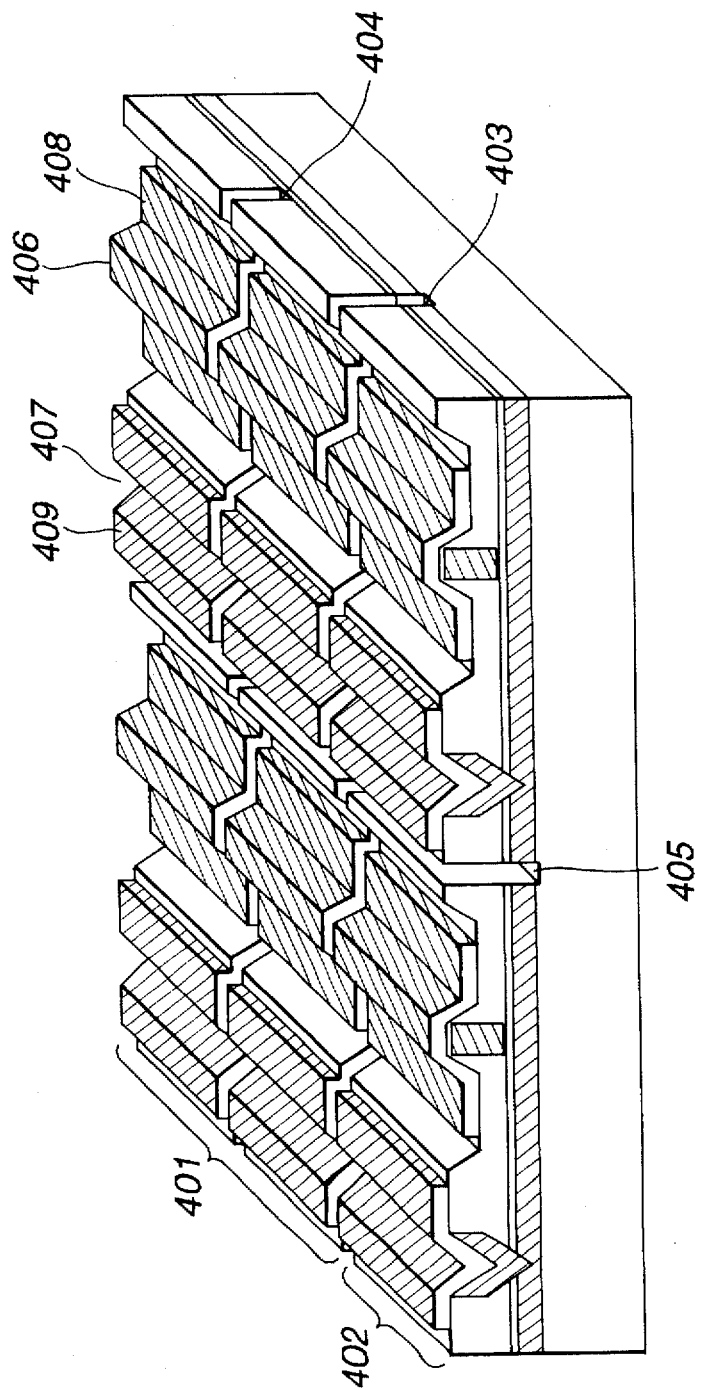
FIG. 5 is a perspective view illustrating a third embodiment of the present invention.

FIG. 5 shows a third embodiment of the present invention. This embodiment is directed to an apparatus in which single mode semiconductor lasers and optical modulators are integrated on a common substrate.

In FIG. 5, the layer structure of a multi-electrode tunable distributed feedback (DFB) laser portion 401 up to an upper clad layer is formed on a semi-insulating GaAs (001) substrate, using the same layer structure as the first embodiment. Then, only a portion 402 corresponding to an optical modulator portion is etched, and layers up to an upper clad layer of the optical modulator portion 402 are again formed. As described above, band gaps of the active layer and the like in the optical modulator portion 402 are varied from those of the DFB laser portion 401. After a grating is formed on the upper clad layer of the DFB laser portion 401 using an interference exposure method, a ridge portion 406 and a contact groove portion 407 are formed over both the DFB laser portion 401 and the optical modulator portion 402.

On the thus-formed wafer, p-type contact layers, n-type clad layers, n-type contact layers and the like are regrown by the CBE using Si as an amphi-conductivity impurity dopant. Then, an $SiO_2$ insulating layer is formed, and after opening windows, p-type electrode 408 and n-type electrode 409 are deposited. Ohmic contacts are formed by alloying those deposited electrodes 408 and 409.

Thereafter, a separating groove 405 reaching the substrate is formed, and integrated devices are electrically separated from each other. The electric separation between the modulator portion 402 and the DFB laser portion 401 is also attained by a groove 403 reaching down to the substrate. In the DFB laser portion 401, the side of the n-type electrode 408 is electrically separated by a groove 404 extending down to the active layer, while the p-type clad layer on the substrate side is electrically connected. In this embodiment, laser light emitted from the DFB laser portion 401 enters the modulator portion 402, and modulated light is output from the modulator portion 402.

As discussed above, complete electric separation between devices can be easily attained by forming the groove extending down to the substrate, since the integrated devices are formed on the semi-insulating substrate in this embodiment.

Thus, in this embodiment, after ridge and groove are formed in the layer structure including the active layer formed on the substrate, light and current confinement structures can be fabricated by performing a single regrowth process, leading to the fabrication without a diffusion process of an optical semiconductor device, such as a laser, having p-type and n-type electrodes on one side of the substrate.

Fourth embodiment

Strictly speaking, the semiconductor laser constructed as shown in FIGS. 3A–3C has problems. First, temperature of the device is raised and its oscillation threshold cannot be reduced because the activation rate of Si in the Si-doped layer exhibiting a p-type conductivity is low and hence resistance of the device increases. Second, the fabrication process is complicated since formations of the ridge and the contact groove are respectively performed by different processes.

A fourth embodiment solves the first problem. In an optical device produced by a fabrication method in which n-type and p-type current injection regions are simultaneously regrown using an amphi-conductivity impurity dopant, resistance of the device is lowered in this embodiment. FIGS. 6A–6C illustrate the fourth embodiment of the present invention.

As shown in FIG. 6A, on a semi-insulating GaAs (001) substrate 501, an undoped GaAs buffer layer 502, a p-type AlGaAs lower clad layer 503, an undoped GaAs/AlGaAs multiple quantum well structure active layer 504 and an n-type AlGaAs upper clad layer 505 are formed in this order.

Then, as shown in FIG. 6A, by employing a patterning by photolithography and a selective etching, layers down to the active layer 504 are removed and a ridge 506 reaching the p-type lower clad layer 503 is formed in a [1$\bar{1}$0] direction. Here, formation of side surfaces of the ridge 506 is performed by a chemical dry etching method known as a reactive ion etching and a wet etching using an etchant of ammonia series. The layers down to the GaAs active layer 504 are removed by the selective etching, and a (001) surface of the lower clad layer 503 is exposed near the ridge 506.

Further, a plurality of contact grooves 507 reaching the p-type lower clad layer 503 are formed in the [1$\bar{1}$0] direction by using another patterning by photolithography and another etching. The grooves 507 are also formed by a wet etching using an etchant of sulphuric acid series, so that a {111}A surface is exposed.

On the thus-formed wafer, as shown in FIG. 6B, AlGaAs layers 508, 509, 510, 511 and 512 and GaAs contact layers 513, 514, 515, 516 and 517 are again grown by the CBE method using Si as an amphi-conductivity impurity dopant.

The AlGaAs layer 508 is an Si-doped AlGaAs layer grown on an n-type AlGaAs (001) surface of the upper clad layer 505 and exhibits an n-type conductivity. The Si-doped AlGaAs layer 509 grown on a {111}A surface of the groove 507 extending from the p-type lower clad layer 503 to the upper clad layer 505 exhibits a p-type conductivity. The layer 511 is an Si-doped AlGaAs layer grown on a {111}A surface at the side of the ridge 506 and exhibits a p-type conductivity. This layer 511 performs a current confinement function for the ridge 506. The layer 512 is an Si-doped AlGaAs layer grown on a (001) surface of the upper clad layer 505 adjacent to the contact groove 507 and exhibits an n-type conductivity, similar to the layer 508. This layer 512 performs a current confinement function for the p-type AlGaAs layer 509. Further, the layer 510 is an Si-doped AlGaAs layer grown on a (001) surface of the bottom surface of an etched groove adjacent to the ridge 506 and exhibits an n-type conductivity.

Conductivity types of the GaAs layers 513, 514, 515, 516 and 517 are observed in the same manner. That is, the GaAs layer 514 at the contact groove 507 exhibits a p-type conductivity, and the GaAs layer 513 at an upper portion of the ridge 506 exhibits an n-type conductivity. The GaAs layer 515 on the bottom surface adjacent to the ridge 506 exhibits an n-type conductivity, the GaAs layer 516 on a slanting surface of the ridge 506 exhibits a p-type conductivity and the GaAs layer 517 on the (001) surface adjacent to the contact groove 507 exhibits an n-type conductivity.

Then, as shown in FIG. 6C, an $SiO_2$ insulating layer 518 is formed, and after opening windows on an upper portion of the ridge 506 and at a p-type electrode portion, p-type electrode 519 and n-type electrode 520 are deposited. Ohmic contacts are formed by alloying those deposited electrodes 519 and 520.

The operation of this embodiment will be described below. Holes injected through the p-type contact layer 514 are supplied to a portion of the GaAs/AlGaAs multiple quantum well structure active layer 504 right below the ridge 506, via the p-type AlGaAs layer 509 and the p-type AlGaAs lower clad layer 503. Electrons injected through the n-type contact layer 513 on the ridge 506 are supplied to the active layer 504 via the n-type AlGaAs layer 508 and the n-type AlGaAs upper clad layer 505. Thus, population inversion due to current injection is established in the active layer 504, and the laser oscillation takes place.

In this embodiment, since a plurality of contact grooves 507 are formed, resistance of the device will not increase though the activation rate of the Si-doped AlGaAs layer 509 grown on the {111}A surface and exhibiting a p-type conductivity is low. Moreover, the area, where the p-type contact layer 514 is exposed, is large compared with the situation where only a single groove is provided, so the window opening process to the $SiO_2$ layer 518 is easier.

In the foregoing, (001) surface, (111) surface and ($\bar{1}\bar{1}1$) surface are used by forming the ridge 506 extending in the [$1\bar{1}0$] direction on the (001) surface, but the surface of the substrate 501 may be its crystallographical equivalent surface, such as (100) surface, (010) surface and ($\bar{1}00$) surface, for only the {111}A surface needs to be used.

Furthermore, the above device can be modified by varying the band gap of the active layer 504 with the same layer structure being used. In this case, a reverse bias voltage is applied across the device, and a device acts as a modulator or a waveguide type PIN detector, due to QCSE and the like. This embodiment can also be applied to the third embodiment shown in FIG. 5.

Fifth embodiment

FIGS. 7A–7C illustrate a fifth embodiment of the present invention. This embodiment solves the above-mentioned second problem that the fabrication process is complicated.

As shown in FIG. 7A, on a semi-insulating GaAs (001) substrate 601, an undoped GaAs buffer layer 602, a p-type AlGaAs lower clad layer 603, an undoped GaAs/AlGaAs multiple quantum well structure active layer 604 and an n-type AlGaAs upper clad layer 605 are formed in this order.

Then, as shown in FIG. 7A, by using a patterning by photolithography and a selective etching, layers from the upper clad layer 605 and the active layer 604 down to the p-type lower clad layer 603 are removed, and a ridge 606 and a plurality of grooves 607 extending in a [$1\bar{1}0$] direction are formed.

Here, formation of side surfaces of the ridge 606 is performed by a wet etching using an etchant of ammonia series, so that a {112}A surface is exposed. At this time, the width $w_1$ of an opening in a resist 621 on the upper clad layer 605 is determined such that the width $w_2$ of an opening in the active layer 604 in the groove 607 is below 0.5 μm. More specifically, in this embodiment in which the thickness of the active layer 604 is 90 nm and the thickness of the upper clad layer 605 is 600 nm, the width $w_1$ of the opening in the resist 621 is from 1.4 μm to 1.9 μm, considering an amount of undercut, since angles between (112) and (001) surfaces and between ($\bar{1}\bar{1}2$) and (001) surfaces (i.e., between the slanting surfaces of the groove 607 and the surface of the substrate 601) are respectively about 35 degrees.

The depth $d_r$ of the etched p-type lower clad layer 603 formed by etching the surroundings of the ridge 606 is preferably small. In this embodiment, the depth $d_r$ is about the same as the depth $d_c$, (e.g. 200 nm) of the etched groove 607 in the active layer 604 which has the opening width $w_2$ of 0.5 μm.

On the thus-formed wafer, AlGaAs layers 608, 609, 610, 611 and 612 and GaAs contact layers 613, 614, 615, 616 and 617 are again grown by the CBE method using Si as an amphi-conductivity impurity dopant.

The AlGaAs layer 608 is an Si-doped AlGaAs layer grown on an n-type AlGaAs (001) surface of the upper clad layer 605 and exhibits an n-type conductivity. The Si-doped AlGaAs layer 609 grown on the {112}A surface of the groove 607 extending from the p-type lower clad layer 603 to the n-type upper clad layer 605 exhibits a p-type conductivity. The layer 611 is an Si-doped AlGaAs layer grown on the {112}A side surface of the ridge 606 and exhibits a p-type conductivity. This layer 611 performs a current confinement function for the ridge 606. The layer 612 is an Si-doped AlGaAs layer grown on the (001) surface of the upper clad layer 605 adjacent to the contact groove 607 and exhibits an n-type conductivity, similar to the layer 608. This layer 612 performs a current confinement function for the p-type AlGaAs layer 609. Further, the layer 610 is an Si-doped AlGaAs layer grown on a (001) surface of the bottom surface of an etched groove adjacent to the ridge 606 and exhibits an n-type conductivity.

Conductivity types of the GaAs layers 613, 614, 615, 616 and 617 are observed in the same manner. That is, the GaAs layer 613 on an upper portion of the ridge 606 exhibits an n-type conductivity, and the GaAs layer 614 at the contact groove 607 exhibits a p-type conductivity. The GaAs layer 615 on the bottom surface adjacent to the ridge 606 exhibits an n-type conductivity, the GaAs layer 616 on the slanting surface of the ridge exhibits a p-type conductivity, and the GaAs layer 617 on the (001) surface adjacent to the contact groove 607 exhibits an n-type conductivity.

Then, an SiO$_2$ insulating layer 618 is formed, and after opening windows on the upper portion of the ridge 606 and at a p-type electrode portion, p-type electrode 619 and n-type electrode 620 are deposited. Ohmic contacts are formed by alloying those deposited electrodes 619 and 620.

Figure 8:
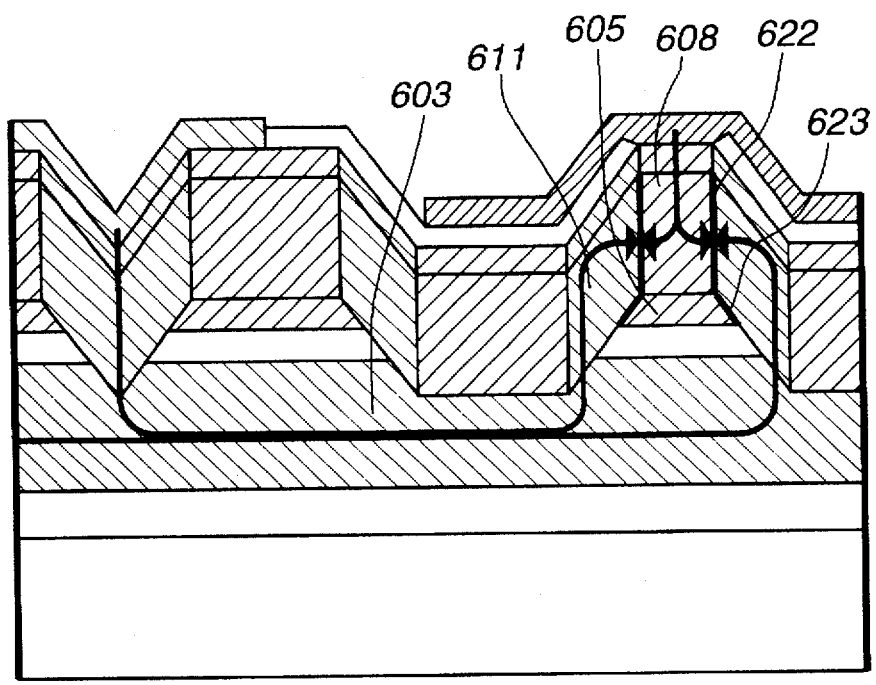
FIG. 8 is a cross-sectional view illustrating a leak current path of the fifth embodiment.

The operation of this embodiment is substantially the same as the fourth embodiment, but the current confinement is not complete in the fifth embodiment and a small leak current path remains. FIG. 8 illustrates the leak current path. Holes in the lower clad layer 603 flow into the p-type AlGaAs layer 611 on the slanting surface of the ridge 606, and those holes recombine with electrons at a pn junction portion 622 between the p-type AlGaAs layer 611 and the n-type AlGaAs layer 608 and at a pn junction portion 623 between the p-type AlGaAs layer 611 and the n-type upper clad AlGaAs layer 605. In this path, it is preferable that the etched depth dr adjacent to the ridge 606 is made as shallow as possible so that an area, at which the lower clad layer 603 is in contact with the p-type AlGaAs layer 611 is decreased for reducing the leak current.

The fifth embodiment is second to the fourth embodiment in that the current confinement is not complete, but the fifth embodiment has the feature that only one etching process is needed to form the ridge 606 and the contact grooves 607 and thus the fabricating process is simplified. This embodiment can also be applied to the third embodiment shown in FIG. 5.

Sixth embodiment

FIGS. 9A–9D illustrate a sixth embodiment of the present invention.

As shown in FIG. 9A, on a semi-insulating GaAs (001) substrate 701, an undoped GaAs buffer layer 702, a p-type AlGaAs lower clad layer 703, a p-type AlGaAs light confinement layer 704, an undoped GaAs/AlGaAs multiple quantum well structure active layer 705 and an n-type AlGaAs light confinement layer 706 are successively formed in this order. On the thus-formed wafer, a resist layer 707 is formed, and a patterning is performed by photolithography.

The wafer is divided into a contact portion 750, current block portions 751 and 753 and a ridge portion 752. In the ridge portion 752, a stripe of the resist 707 having a width of 1 μm remains. The contact portion 750 has a plurality of stripe-shaped opening portions, and the width $w_c$ of the opening portion has such a value that a V-shaped groove, which will be formed by a succeeding etching, can reach the p-type AlGaAs lower clad layer 703 through the active layer 705 and the p-type AlGaAs light confinement layer 704. The current block portions 751 and 753 are respectively formed between the ridge portion 752 and the contact portion 750 and outside of the ridge portion 752. The current block portions 751 and 753 also have one or a plurality of stripe-shaped opening portions. The width $w_b$ of the opening portion has such a value that a V-shaped groove, which will be formed by a succeeding etching, can reach the active layer 705 but cannot reach the p-type AlGaAs light confinement layer 704.

Specifically, in this embodiment in which the thickness of the p-type AlGaAs light confinement layer 704 is 500 nm, the thickness of the undoped GaAs/AlGaAs active layer 705 is 100 nm and the thickness of the n-type AlGaAs light confinement layer 706 is 500 nm, the width $w_b$ of the opening in the current block portions 751 and 753 is from 0.9 μm to 1.2 μm and the width $w_c$ of the opening in the contact portion 750 is from 1.2 μm to 2.6 μm, considering an amount of undercut, since a wet etching, in which a {112} surface inclined about 35 degrees from a (001) surface is exposed, is used. The longitudinal directions of the stripes of resist pattern all extend in a [1̄10] direction.

A wet etching using sulphuric acid series is performed, using the thus-formed resist pattern as a mask. Thus, the ridge and V-shaped grooves, which constitute the current block portions 751 and 753 and the contact portion 750, are formed as illustrated in FIG. 9B. Then the resist 707 is removed.

On the thus-formed wafer, AlGaAs layers 708, 709, 710, 711 and 712 and GaAs contact layers 713, 714, 715, 716 and 717 are again grown by the CBE method using Si as an amphi-conductivity impurity dopant.

The AlGaAs layer 708 is an Si-doped AlGaAs layer grown on an n-type AlGaAs (001) surface of the light confinement layer 706 and exhibits an n-type conductivity. The Si-doped AlGaAs layer 709 grown on the {112}A surface of the current block portions 751 and 753 exhibits a p-type conductivity. The layer 711 is an Si-doped AlGaAs layer grown on the {112}A surface of the contact groove and exhibits a p-type conductivity. This layer 711 forms an injection path for holes. The layer 710 is an Si-doped AlGaAs layer grown on an n-type AlGaAs (001) exposed surface other than the ridge portion and exhibits an n-type conductivity. This layer 710 electrically separates the p-type AlGaAs layer 709 of the current block portion 751 from the p-type AlGaAs layer 711 of the contact portion 750. Further, the layer 712 is an Si-doped AlGaAs layer grown on the bottom surface of a (001) surface of the lower clad layer 703 adjacent to the ridge and exhibits an n-type conductivity.

Conductivity types of the GaAs layers 713, 714, 715, 716 and 717 are observed in the same manner. That is, the GaAs layer 713 on the ridge exhibits an n-type conductivity, the GaAs layer 714 on the {112}A surface of the current block portions 751 and 753 exhibits a p-type conductivity. The GaAs layer 715 on the (001) surface of the current block portions 751 and 753 exhibits an n-type conductivity, the GaAs layer 716 on the {112}A surface of the contact groove exhibits a p-type conductivity, and the GaAs layer 717 on the bottom surface adjacent the ridge exhibits an n-type conductivity.

Then, an SiO$_2$ insulating layer 718 is formed, and after opening windows on the upper portion of the ridge and at a p-type electrode portion, p-type electrode 719 and n-type electrode 720 are deposited. Ohmic contacts are formed by alloying those deposited electrodes 719 and 720.

Like the fifth embodiment, this embodiment has the feature that only one etching process is needed to form the ridge and the contact grooves and hence the fabrication process is shortened. Further, in this embodiment, the depth of the groove formed by the etching can be controlled by changing the stripe width formed by photolithography, and a laser structure, in which a leak current is small, can be easily fabricated. This embodiment can also be applied to the third embodiment shown in FIG. 5.

Seventh embodiment

As discussed in the foregoing, the semiconductor laser constructed as described in the first embodiment has the problem that the fabrication process is complicated since formations of the ridge and the contact groove are performed in different and separate etching processes. Further, in the first embodiment, reproducibility of the ridge width is not good when layers down to the active layer are removed by the selective etching. On the other hand, in the fifth and sixth embodiments in which the ridge portion and contact groove portion are simultaneously etched during a single process, a high precision is required to controlling the etching depth adjacent to the ridge, and the leak current path is likely to remain.

The seventh embodiment solves those problems. In an optical device produced by a fabrication method in which n-type and p-type current injection regions are simultaneously regrown using an amphi-conductivity impurity dopant, this embodiment aims to readily form a current block region for separating the current injection regions from each other.

Figure 10A:
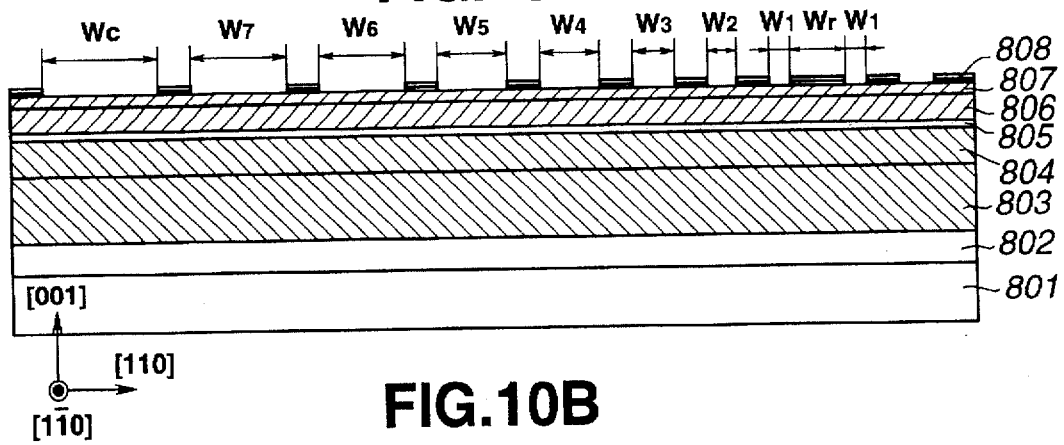
FIGS. 10A–10D are respectively cross-sectional views illustrating steps for fabricating a seventh embodiment of the present invention.

FIGS. 10A–10D illustrate a seventh embodiment of the present invention. As shown in FIG. 10A, on a semi-insulating GaAs (001) substrate 801, an undoped GaAs buffer layer 802, a p-type AlGaAs lower clad layer 803, a p-type AlGaAs light confinement layer 804, an undoped GaAs/AlGaAs multiple quantum well structure active layer 805, an n-type AlGaAs light confinement layer 806 and an n-type AlGaAs upper clad layer 807 are successively formed in this order.

Then, a photoresist layer 808 is formed on the thus-fabricated wafer and a patterning is conducted by photolithography. In FIG. 10A, the width of a resist-remaining portion is depicted on a reduced scale.

As a ridge portion, a stripe having the width $w_r$ remains. An opening portion having the width $w_c$ is formed as a current block portion. Between the ridge portion and the contact portion, seven opening portions having respective widths $w_1$–$w_7$ are formed as a current block portion. Those stripes and opening portions all extend in a [1$\bar{1}$0] direction.

Figure 11A:
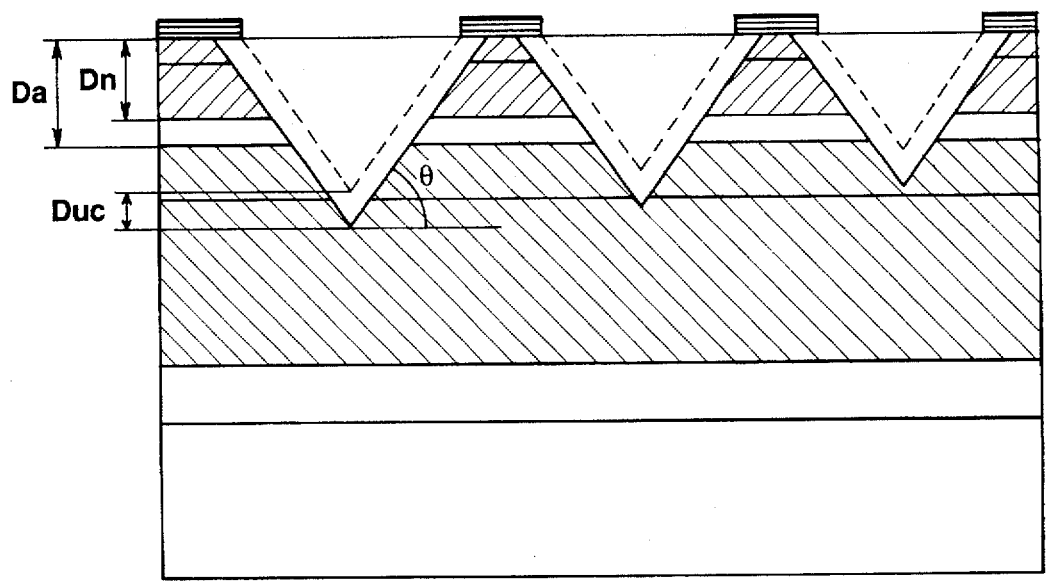
FIGS. 11A and 11B are respectively views illustrating undercut and the like of the seventh embodiment.

The opening widths $w_1$–$w_7$ in the current block portion monotonically increase as $w_1 < w_2 < \ldots < w_7$. Further, the mask pattern, satisfying a relation of $$w_{n+1} - w_n < 2(D_a - D_n)/\tan\theta \quad (n=1, \ldots, 6) \quad (1)$$

or $\Delta w < 2D/\tan\theta$ (where $w_{n+1} - w_n = \Delta w$ and $D_a - D_n = D$), is used such that the difference in depth between adjacent etched grooves is smaller than the thickness of the undoped active layer 805. Here, as shown in FIG. 11A, $D_n$ is the sum thickness of the n-type AlGaAs light confinement layer 806 and the n-type AlGaAs upper clad layer 807, $D_a$ is the sum thickness of the layers 806 and 807 and the active layer 805, and $\theta$ is the angle between the slanting surface of the etched groove and the substrate surface.

Further, the mask pattern, satisfying a relation of $w_1$ and $w_7$ $$w_1 < 2(D_n - D_{uc})/\tan\theta$$

or $2(D_n - D_{uc})/\tan\theta < w_7$ (where $D_{uc}$ is the etched amount in a direction of depth by the undercut during etching), is used. The undercut amount is determined from etching conditions and fluctuates in a certain range, but $w_1$ and $w_7$ are caused to satisfy the above relation even if such fluctuation exists. In this embodiment, concerning the fluctuation of etching depth, a deviation from a target value as much as about twice the thickness of the undoped active layer 805 is permitted. Dependency of the undercut amount on the opening width is disregarded.

Figure 10B:
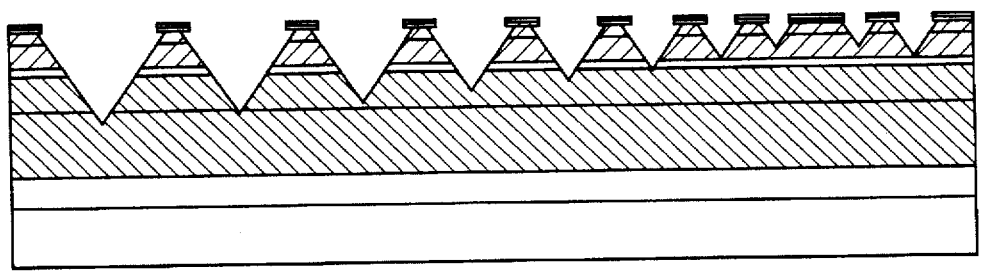
Figure 10C:
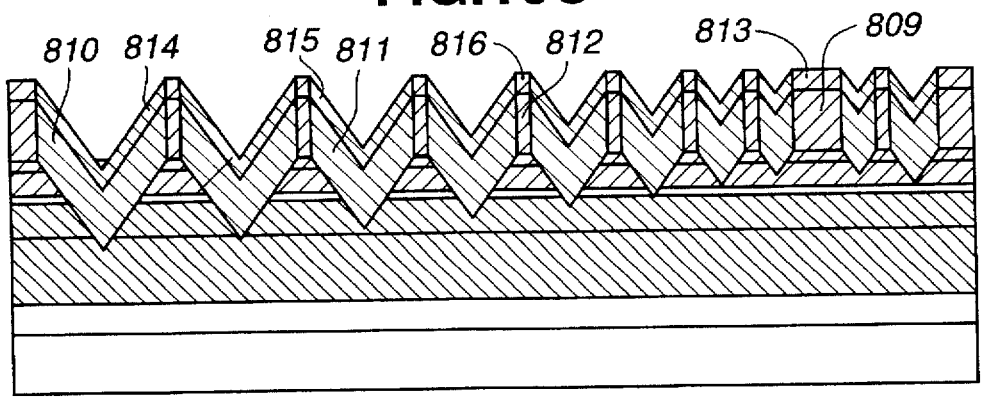
Figure 11B:
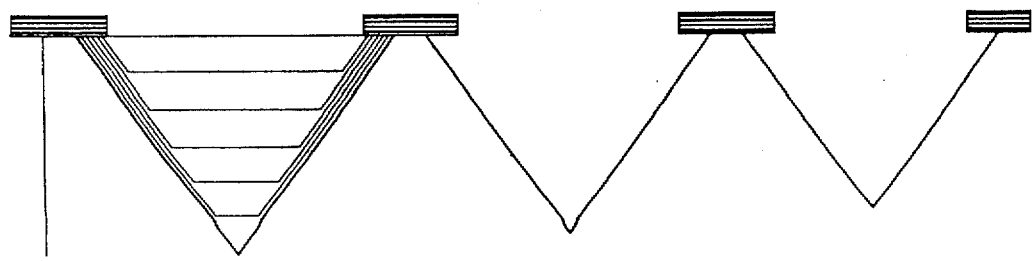

As illustrated in FIG. 11B, when a wet etching is performed using phosphoric acid series, a {111}A surface inclined about 55 degrees from the (00) surface is exposed since the etching rate for the {111}A surface is smaller than the etching rate for the (001) surface. The undercut occurs as shown in FIG. 10B. When the opening width of the resist 808 is $w_i$, the depth of the etched groove amounts to $$(w_i \tan\theta)/2 + D_{uc}$$

where $D_{uc}$ is a value which is determined from etching rate and etching time. When the opening width satisfies relation (1), there necessarily exists one groove whose depth just reaches the undoped active layer 805, out of the grooves in the current block portion, even if the etching rate and the etching time somewhat fluctuate. This groove substantially acts as the current block portion. More specifically, the groove nearest to the ridge has a depth that does not reach the active layer 805, and the groove nearest to the contact groove has a depth that extends down beyond the active layer 805. Further, the depth difference between the adjacent grooves is set at a value that does not surpass the thickness of the active layer 805. Thus, there necessarily exists one groove that reaches the active layer 805 but does not extend beyond the active layer 805, irrespective of an etching error during the etching process of the grooves.

After the resist 808 is removed, AlGaAs layers 809, 810, 811 and 812 and GaAs contact layers 813, 814, 815 and 816 are again grown on the thus-formed wafer by the CBE method using Si as an amphi-conductivity impurity dopant.

The AlGaAs layer 809 is an Si-doped AlGaAs layer grown on an n-type AlGaAs (001) surface of the upper clad layer 807 and exhibits an n-type conductivity. The Si-doped AlGaAs layer 810 grown on the {111}A surface of the contact groove portion exhibits a p-type conductivity. The layer 811 is an Si-doped AlGaAs layer grown on the {111}A surface of the current block portion and exhibits a p-type conductivity. The layer 812 is an Si-doped AlGaAs layer grown on the (001) surface of the upper clad layer 807 outside the ridge portion and exhibits an n-type conductivity, similar to the layer 809.

Conductivity types of the GaAs layers 813, 814, 815 and 816 are observed in the same manner. That is, the GaAs layer 813 on an upper portion of the ridge exhibits an n-type conductivity, and the GaAs layer 814 at the contact groove portion exhibits a p-type conductivity. The GaAs layer 815 at the current block groove portion exhibits a p-type conductivity, and the GaAs layer 816 on the (001) surface of the upper clad layer 807 exhibits an n-type conductivity.

Then, an $SiO_2$ insulating layer 817 is formed, and after opening windows on the upper portion of the ridge and at a p-type electrode portion, p-type electrode 819 and n-type electrode 820 are deposited. Ohmic contacts are formed by alloying those deposited electrodes 819 and 820.

The operation of this embodiment will be described below. Holes injected through the p-type contact layer 814 from the p-type electrode 819 are supplied to a portion of the GaAs/AlGaAs multiple quantum well structure active layer 805 right below the ridge, via the p-type AlGaAs layer 810, the p-type AlGaAs lower clad layer 803 and the p-type light confinement layer 804. Electrons injected through the n-type contact layer 813 at the upper portion of the ridge are supplied to the active layer 805 via the n-type AlGaAs layer 809, the n-type AlGaAs upper clad layer 807 and the n-type light confinement layer 806. Thus, population inversion due to current injection is observed in the active layer 805, and the laser oscillation takes place.

Figure 10D:
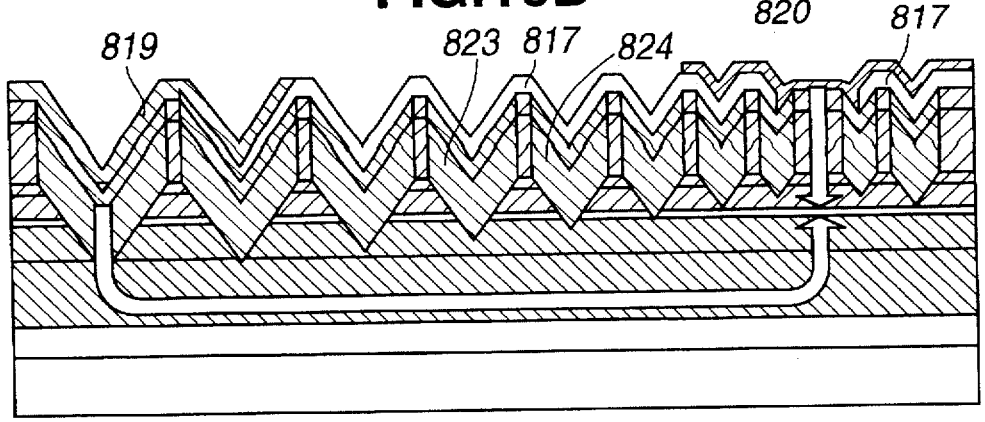

As illustrated in FIG. 10D, in the current block portion, at the groove whose depth just reaches the undoped active layer 805, the p-type AlGaAs layer 824 grown on the groove electrically divides each of the n-type AlGaAs layers 806 and 807 into two portions which are located on left and right sides of the groove. At the grooves deeper than the above groove, the p-type layer 823 in the current block portion is electrically connected to the p-type lower light confinement layer 804. However, in the leak current path from the p-type layer 823 to the n-type electrode 820 via the n-type upper clad layer 807 and the upper light confinement layer 806, a reverse bias condition is established due to an np junction at the p-type AlGaAs layer 824 and hence the leak current is reduced.

In this embodiment, only one contact groove is illustrated, but it is preferable that a plurality of contact grooves are formed. In this case, resistance of the device will not increase though the activation rate of the Si-doped AlGaAs layer 810 grown on the {111}A surface and exhibiting a p-type conductivity is low. Moreover, an area, at which the p-type contact layer 814 is exposed, is widened, compared with the case where only a single contact groove is provided, and hence a window opening process on the $SiO_2$ layer 817 becomes easy.

In the foregoing, (001) surface, (111) surface and ($\bar{1}\bar{1}1$) surface are used by forming the ridge extending in the [1$\bar{1}$0] direction on the (001) surface, but the surface of the substrate may be its crystallographical equivalent surface, such as (100) surface, (010) surface and ($\bar{1}$00) surface, for a {111}A surface only needs to be used.

Furthermore, the above device can be modified by varying the band gap of the active layer with the same layer structure being used. In this case, a reverse bias voltage is applied across the device and a device acts as a modulator or a waveguide type PIN detector, due to QCSE and the like. This embodiment can also be applied to the third embodiment.

Eighth embodiment

FIGS. 12A–12D illustrate an eighth embodiment of the present invention. As shown in FIG. 12A, on a semi-insulating GaAs (111)A substrate 901, an undoped GaAs buffer layer 902, an n-type AlGaAs lower clad layer 903, an n-type AlGaAs lower light confinement layer 904, an undoped GaAs/AlGaAs multiple quantum well structure active layer 905, a p-type AlGaAs upper light confinement layer 906 and a p-type AlGaAs upper clad layer 907 are successively formed in this order.

Next, a photoresist layer 908 is formed on the thus-fabricated wafer and a patterning is conducted by photolithography. As a ridge portion, a stripe having the width $w_{4r}$ remains. An opening portion having the width $w_{4c}$ is formed as a contact groove portion. Five opening portions having different widths $w_{41}$–$w_{45}$ are provided as a current block portion between a ridge portion and a contact portion.

Those stripes and opening portions all extend in a [1$\bar{1}$0] direction. Similar to the seventh embodiment, the widths $w_{41}$–$w_{45}$ of the opening portions in the current block portion is gradually widened as approaching the contact portion from the ridge portion.

As illustrated in FIG. 12B, when a wet etching is performed using sulphuric acid series, an inclined V-shaped groove surrounded by (001) and (110) surfaces is formed by utilizing a difference in etching rate depending on the orientation of crystal surface.

Similar to the seventh embodiment, there necessarily exists one groove whose depth just reaches the undoped active layer 905, out of the grooves in the current block portion, even if etching rate and etching time somewhat fluctuate. This groove substantially acts as the current block portion.

AlGaAs layers 910–914 and GaAs contact layers 915–919 are again grown on the thus-formed wafer by the CBE method using Si as an amphi-conductivity impurity dopant.

The AlGaAs layer 910 grown on the ridge is an Si-doped AlGaAs layer grown on a (001) surface of the upper clad layer 907 and exhibits a p-type conductivity. The Si-doped AlGaAs layers 911 and 912 formed on the contact groove portion and grown on (001) and (110) surfaces of the lower clad layer 903, the active layer 905 and the upper clad layer 907 exhibit an n-type conductivity. The layers 913 are Si-doped AlGaAs layers grown on the grooves in the current block portion and adjacent to the ridge and exhibit an n-type conductivity. The layer 914 is an Si-doped AlGaAs layer grown on a (111) surface of the layer outside of the ridge portion and exhibits a p-type conductivity.

Conductivity types of the GaAs layers 915–919 are observed in the same manner. That is, the GaAs layer 915 on an upper portion of the ridge exhibits a p-type conductivity, and the GaAs layers 916 and 917 at the contact groove portion exhibit an n-type conductivity. The GaAs layer 918 in the current block groove portion exhibits an n-type conductivity, and the GaAs layer 919 on the (111) surface of the upper clad layer 907 exhibits a p-type conductivity.

Then, an $SiO_2$ insulating layer 920 is formed, and after opening windows on the upper portion of the ridge and at an n-type electrode portion, p-type electrode 921 and n-type electrode 922 are deposited. Ohmic contacts are formed by alloying those deposited electrodes 921 and 922.

The operation of this embodiment will be described below. Electrons injected through the n-type contact layers 916 and 917 from the n-type electrode 922 are supplied to a portion of the GaAs/AlGaAs multiple quantum well structure active layer 905 right below the ridge, via the n-type AlGaAs layers 911 and 912, the n-type AlGaAs lower clad layer 903 and the n-type light confinement layer 904. Holes injected through the p-type contact layer 915 on the upper portion of the ridge are supplied to the active layer 905 via the p-type AlGaAs layer 910, the p-type AlGaAs upper clad layer 907 and the p-type light confinement layer 906. Thus, population inversion due to current injection is observed in the active layer 905, and the laser oscillation takes place.

Furthermore, the above device can be modified by varying the band gap of the active layer 905 with the same layer structure being used. In this case, a reverse bias voltage is applied across the device and a device acts as a modulator or a waveguide type PIN detector, due to QCSE and the like.

In the foregoing, the ridge extending in the [110] direction on the (111) surface is formed, but on the (111) surface, two directions of [01$\bar{1}$] and [$\bar{1}$01, which are crystallographically equivalent to the [1$\bar{1}$0], exist. Any one can be selected. As for the rest, this embodiment is the same as the seventh embodiment.

Ninth embodiment

FIGS. 13A–13D illustrate a ninth embodiment of the present invention. As shown in FIG. 13A, on an $n^+$-type GaAs (001) substrate 1101, an n-type GaAs buffer layer 1102, an n-type AlGaAs lower clad layer 1103, an undoped GaAs/AlGaAs multiple quantum well structure light guide layer 1104, a p-type AlGaAs separating layer 1105, an undoped GaAs/AlGaAs multiple quantum well structure active layer 1106, and an n-type AlGaAs upper clad layer 1107 are successively formed in this order.

Then, as shown in FIG. 13A, a patterning is conducted by photolithography and a selective etching is performed. Thus, layers down to the active layer 1106 are removed, and a ridge 1108 reaching the p-type separating layer 1105 is formed extending in a [1$\bar{1}$0] direction.

At this time, a chemical dry etching method known as reactive ion etching and a wet etching using an etchant of ammonia series are both used such that a {111}A surface is exposed on the side surface of the ridge 1108. The layers down to the active layer 1106 are removed by selectivity for Al mole fraction ratio, and a (001) surface of the separating layer 1105 is exposed near the ridge 1108.

Then, as illustrated in FIG. 13B, a plurality of contact grooves 1109 reaching the p-type separating layer 1105, which are deeper than the ridge 1108 and extend in the [1$\bar{1}$0] direction, are formed by using another patterning by photolithography and another etching. The grooves 1109 are formed by another wet etching using an etchant of sulphuric acid series, such that a {112}A surface is exposed on the side surface of the groove 1109.

As shown in FIG. 13C, AlGaAs layers 1110–1114 and GaAs contact layers 1115–1119 are again grown on the thus-formed wafer by the CBE method using Si as an amphi-conductivity impurity dopant.

The AlGaAs layer 1110 is an Si-doped AlGaAs layer grown on an n-type AlGaAs (001) surface of the upper clad layer 1107 and exhibits an n-type conductivity. The Si-doped AlGaAs layer 1111 formed on the {112}A surface of the contact groove 1109 extending from the p-type separating layer 1105 to the upper clad layer 1107 exhibits a p-type conductivity. The layer 1112 is an Si-doped AlGaAs layer grown on a {111}A side surface of the ridge 1108 and exhibits a p-type conductivity. This layer 1112 performs a current confinement function for the ridge 1108. The layer 1113 is an Si-doped AlGaAs layer grown on the (001) surface of the upper clad layer 1107 adjacent to the contact groove 1109 and exhibits an n-type conductivity, similar to the layer 1110. This layer 1113 performs a current confinement function for the p-type AlGaAs layer 1111. The layer 1114 is an Si-doped AlGaAs layer grown on a (001) surface of the bottom surface adjacent to the ridge 1108 and exhibits an n-type conductivity.

Conductivity types of the GaAs layers 1115–1119 are observed in the same manner. That is, the GaAs layer 1115 on an upper portion of the ridge 1108 exhibits an n-type conductivity, and the GaAs layer 1116 at the contact groove 1109 exhibits a p-type conductivity. The GaAs layer 1117 on a slanting surface of the ridge 1108 exhibits a p-type conductivity, the GaAs layer 1118 on the (001) surface adjacent to the contact groove 1109 exhibits an n-type conductivity, and the GaAs layer 1119 on the bottom surface adjacent to the ridge 1108 exhibits an n-type conductivity.

Then, as illustrated in FIG. 13D, an $SiO_2$ insulating layer 1120 is formed, and after opening windows on the upper portion of the ridge 1108 and at a p-type electrode portion, p-type electrode 1121 and n-type electrodes 1122 and 1123 are deposited. Ohmic contacts are formed by alloying those deposited electrodes 1121, 1122 and 1123.

The operation of this embodiment will be described. Holes injected through the p-type contact layer 1116 are supplied to a portion of the GaAs/AlGaAs multiple quantum well structure active layer 1106 right below the ridge 1108, via the p-type AlGaAs layer 1111 and the p-type AlGaAs separating layer 1105. Electrons injected through the n-type contact layer 1115 at the upper portion of the ridge 1108 are supplied to the active layer 1106 via the n-type AlGaAs layer 1110 and the n-type upper clad layer 1107. Thus, population inversion due to current injection is observed in the active layer 1106, and the laser oscillation takes place.

Further, it is possible to apply an electric field across the light guide layer 1104 by imparting a higher bias voltage to the n-type electrode 1122 on the side of the substrate 1101, than the p-type electrode 1121. Thereby, carriers can be swept out from the light guide layer 1104, and the refractive index of the light guide layer 1104 can be modulated due to QCSE. Thus, a wavelength-changeable or tunable device, which has a simple dependency on a modulation current similar to the TTG, can be constructed.

In this embodiment, a plurality of contact grooves 1109 are arranged, so that resistance of the device would not be increased even if the activation rate of the Si-doped AlGaAs layer 1111, that is grown on the {112}A surface and exhibits a p-type conductivity, is low. Further, the width of the contact groove 1109 can be enlarged by setting the surface index of the slanting surface of the contact groove 1109 such that the slope of the slanting surface of the groove 1109 relative to the substrate 1101 is gentle. Furthermore, the window opening process on the $SiO_2$ layer 1120 can be facilitated since an area of the exposed p-type contact layer 1116 is large, compared with a case where only a single groove is formed.

In the foregoing, the ridge extending in the $[1\bar{1}0]$ direction on the (001) surface is formed, and (001), (111), $(\bar{1}\bar{1}1)$, (112) and $(\bar{1}\bar{1}2)$ surfaces are utilized. However, since {111}A surface and {112}A surface only need to be utilized, the surface of the substrate 1101 may be any one of (100) surface, (010) surface, $(\bar{1}00)$ surface and the like which are crystallographically equivalent to a (001) surface.

This embodiment can also be applied to the third embodiment. In this case, no grating need to be formed.

Tenth embodiment

Figure 14A:
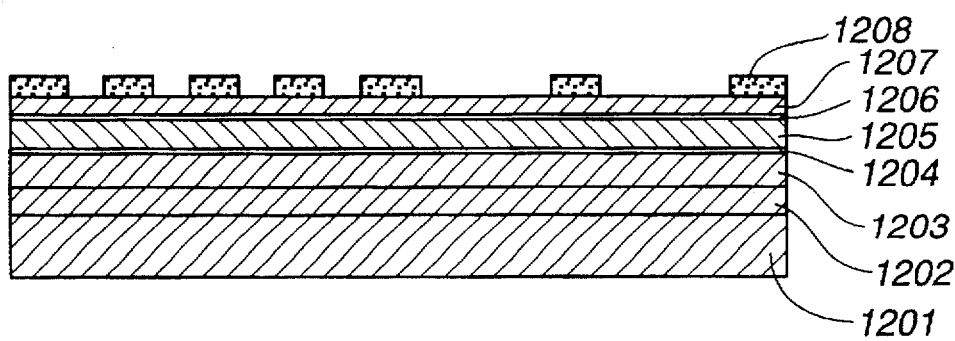
FIGS. 14A–14D are respectively cross-sectional views illustrating steps for fabricating a tenth embodiment of the present invention.

FIGS. 14A–14D illustrate a tenth embodiment of the present invention. As shown in FIG. 14A, on an $n^+$-type GaAs (001) substrate 1201, an n-type GaAs buffer layer 1202, an n-type AlGaAs lower clad layer 1203, an undoped GaAs/AlGaAs multiple quantum well structure light guide layer 1204, a p-type AlGaAs separating layer 1205, an undoped GaAs/AlGaAs multiple quantum well structure active layer 1206, and an n-type AlGaAs upper clad layer 1207 are successively formed in this order. Then, a resist layer 1208 is formed, and a patterning is performed by photolithography.

Figure 14B:
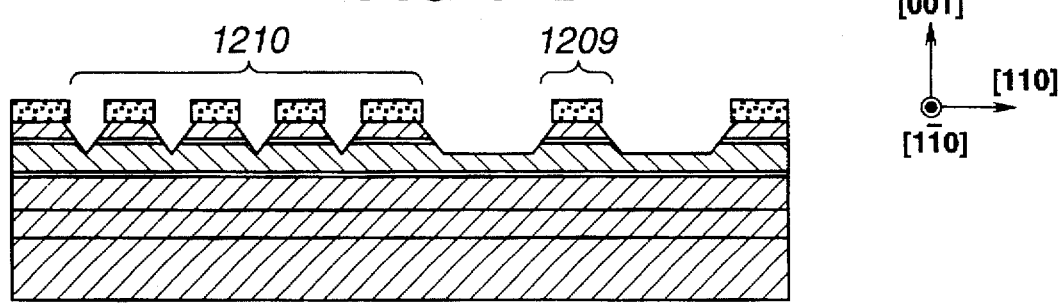

Next, as shown in FIG. 14B, a selective etching is performed. Thus, the upper clad layer 1207, the active layer 1206 and a part of the separating layer 1205 are removed, and a plurality of ridges 1209 and a plurality of etching grooves 1210 are formed extending in a $[1\bar{1}0]$ direction. At this time, a wet etching using an etchant of ammonia series is used such that a {111}A surface is exposed on the side surface of the ridge 1209.

Figure 14C:
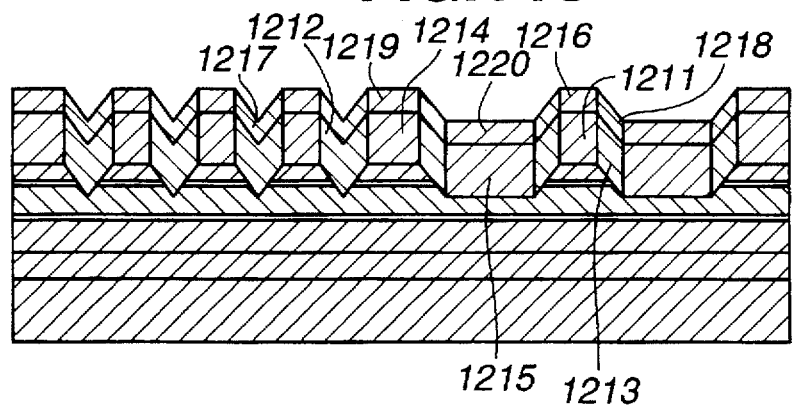

As shown in FIG. 14C, AlGaAs layers 1211–1215 and GaAs contact layers 1216–1220 are again grown on the thus-formed wafer by the CBE method using Si as an amphi-conductivity impurity dopant.

The AlGaAs layer 1211 is an Si-doped AlGaAs layer grown on an n-type AlGaAs (001) surface of the upper clad layer 1207 and exhibits an n-type conductivity. The Si-doped AlGaAs layer 1212 formed on a {111}A surface of the contact groove 1210 extending from the p-type separating layer 1205 to the upper clad layer 1207 exhibits a p-type conductivity. The layer 1213 is an Si-doped AlGaAs layer grown on a {111}A side surface of the ridge 1209 and exhibits a p-type conductivity. This layer 1213 performs a current confinement function for the ridge 1209. The layer 1214 is an Si-doped AlGaAs layer grown on a (001) surface of the upper clad layer 1207 adjacent to the contact groove 1210 and exhibits an n-type conductivity, similar to the layer 1211. This layer 1214 performs a current confinement function for the p-type AlGaAs layer 1212. The layer 1215 is an Si-doped AlGaAs layer grown on a (001) surface of the bottom surface adjacent to the ridge 1209 and exhibits an n-type conductivity.

Conductivity types of the GaAs layers 1216–1220 are observed in the same manner. That is, the GaAs layer 1216 on an upper portion of the ridge 1209 exhibits an n-type conductivity, and the GaAs layer 1217 at the contact groove 1210 exhibits a p-type conductivity. The GaAs layer 1218 on a slanting surface of the ridge 1209 exhibits a p-type conductivity, the GaAs layer 1219 on a (001) surface adjacent to the contact groove 1210 exhibits an n-type conductivity, and the GaAs layer 1220 on the bottom surface adjacent to the ridge 1209 exhibits an n-type conductivity.

Figure 14D:
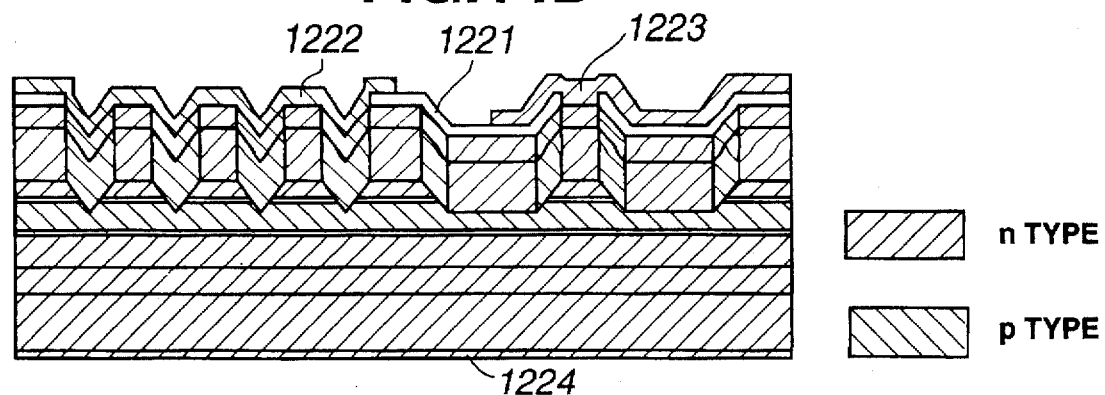

Then, as illustrated in FIG. 14D, an SiO$_2$ insulating layer 1221 is formed, and after opening windows on the upper portion of the ridge 1209 and at a p-type electrode portion, p-type electrode 1222 and n-type electrodes 1223 and 1224 are deposited. Ohmic contacts are formed by alloying those deposited electrodes 1222, 1223 and 1224.

The operation of this embodiment is substantially the same as the ninth embodiment, but the current confinement is not complete in this embodiment and a small leak current path remains from the p-type separating layer 1205 to the p-type confinement layer 1213. However, the tenth embodiment has the feature that only one etching process is needed to form both the ridge 1209 and the contact grooves 1210 and thus the fabrication process is shortened.

Further, similar to the ninth embodiment, it is possible to apply an electric field across the lower light guide layer 1204 by imparting a higher bias voltage to the n-type electrode 1224 on the side of the substrate 1201, than the p-type electrode 1222. Thereby, the oscillation wavelength can be changed.

Figure 15A:
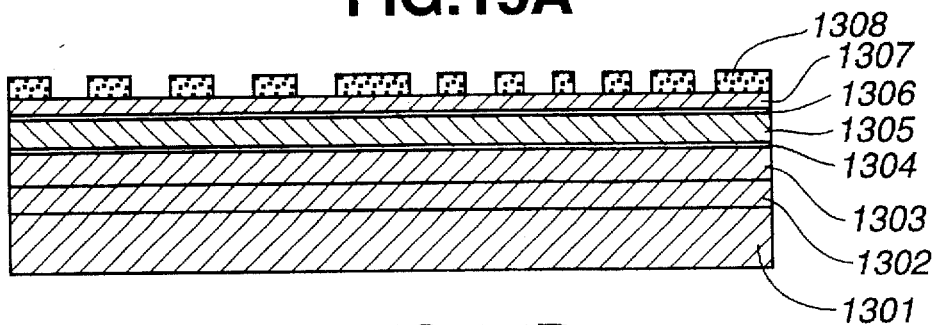
FIGS. 15A–15D are respectively cross-sectional views illustrating steps for fabricating an eleventh embodiment of the present invention.

This embodiment can also be applied to the third embodiment. In this case, no grating need to be formed.
Eleventh embodiment FIGS. 15A–15D illustrate an eleventh embodiment of the present invention. As shown in FIG. 15A, on an n$^+$-type GaAs (001) substrate 1301, an n-type GaAs buffer layer 1302, an n-type AlGaAs lower clad layer 1303, an undoped GaAs/AlGaAs multiple quantum well structure light guide layer 1304, a p-type AlGaAs separating layer 1305, an undoped GaAs/AlGaAs multiple quantum well structure active layer 1306, and an n-type AlGaAs upper clad layer 1307 are formed in this order. Then, a resist layer 1308 is formed, and a patterning is performed by photolithography.

Figure 15B:
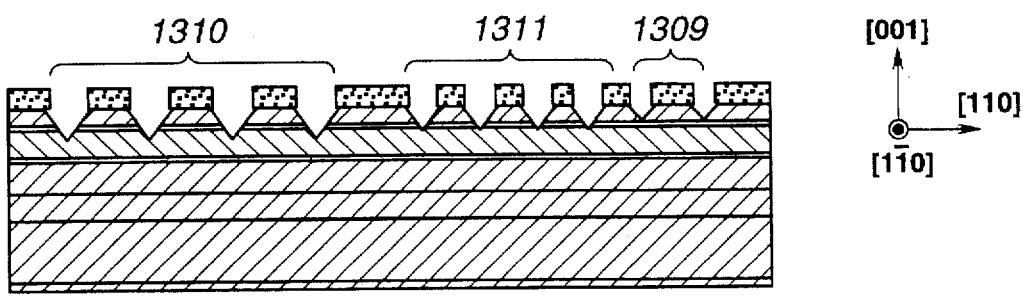

Next, as shown in FIG. 15B, a selective etching is performed. Thus, the upper clad layer 1307 and the active layer 1306 are removed, and a ridge 1309, a plurality of deep etched grooves 1310 and a plurality of shallow etched grooves 1311 are formed extending in a [1$\bar{1}$0] direction. The depth of the grooves 1310 and 1311 is controlled by the width of opening portions formed by the photolithography. At this time, a wet etching using an etchant of ammonia series is used such that a {111}A surface is exposed on the side surface of the ridge 1309.

Figure 15C:
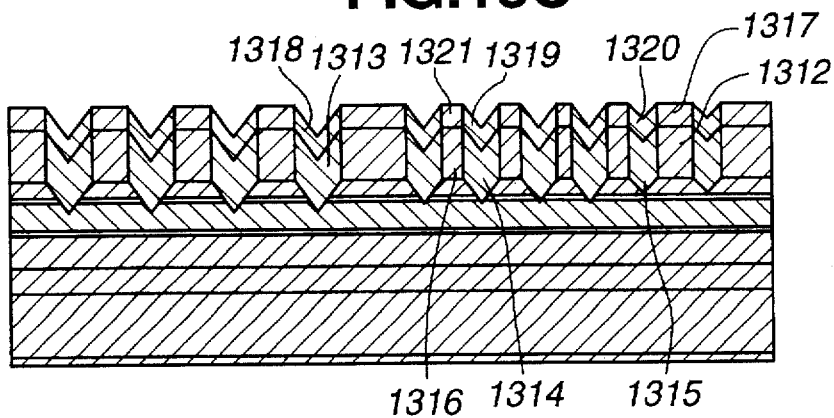

As shown in FIG. 15C, AlGaAs layers 1312–1316 and GaAs contact layers 1317–1321 are again grown on the thus-formed wafer by the CBE method using Si as an amphi-conductivity impurity dopant.

The AlGaAs layer 1312 is an Si-doped AlGaAs layer grown on an n-type AlGaAs (001) surface of the upper clad layer 1307 and exhibits an n-type conductivity. The Si-doped AlGaAs layer 1313 formed on a {111}A surface of the contact groove 1310 extending from the p-type separating layer 1305 to the upper clad layer 1307 exhibits a p-type conductivity. The layer 1314 is an Si-doped AlGaAs layer grown on a {111}A surface of the shallow groove or current block portion 1311 and exhibits a p-type conductivity. The layer 1315 is an Si-doped AlGaAs layer grown on a {111}A side surface of the ridge 1309 and exhibits a p-type conductivity. This layer 1315 performs a current confinement function for the ridge 1309. The layer 1316 is an Si-doped AlGaAs layer grown on a (001) surface of the upper clad layer 1307 in the current block portion 1311 and exhibits an n-type conductivity, similar to the layer 1312. The layer 1316 and the p-type AlGaAs layer 1314 are alternated to form a pnpn current confinement structure.

Conductivity types of the GaAs layers 1317–1321 are observed in the same manner. That is, the GaAs layer 1317 on an upper portion of the ridge 1309 exhibits an n-type conductivity, and the GaAs layer 1318 at the contact grooves 1310 exhibits a p-type conductivity. The GaAs layer 1319 in the current block portion 1311 exhibits a p-type conductivity, the GaAs layer 1320 on the slanting surface of the ridge 1309 exhibits a p-type conductivity, and the GaAs layer 1321 on the (001) surface in the current block portion 1311 exhibits an n-type conductivity.

Figure 15D:
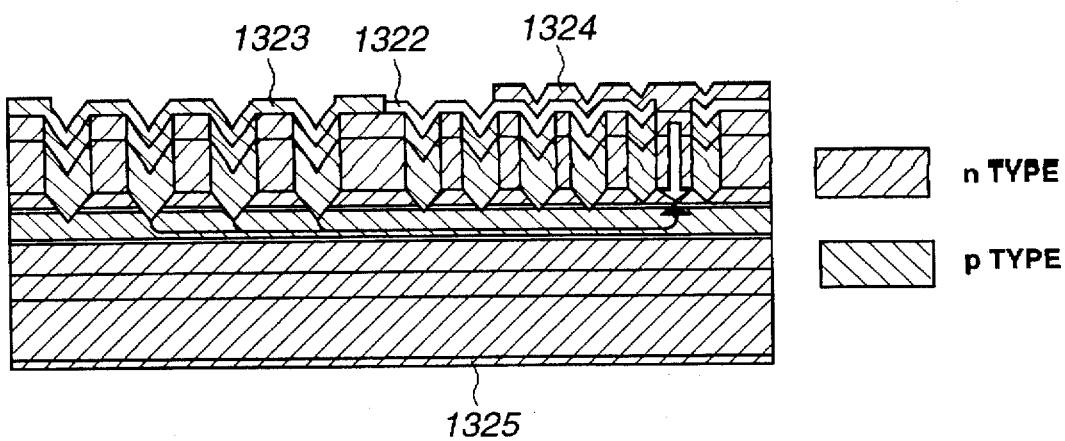

Then, as illustrated in FIG. 15D, an SiO$_2$ insulating layer 1322 is formed, and after opening windows on the upper portion of the ridge 1309 and at a p-type electrode portion, p-type electrode 1323 and n-type electrodes 1324 and 1325 are deposited. Ohmic contacts are formed by alloying those deposited electrodes 1323, 1324 and 1325.

The operation of this embodiment is substantially the same as the ninth embodiment. This embodiment has the feature that only one etching process is needed to form the ridge 1309, the contact grooves 1310 and the current block portion 1311, and the etching depth is varied depending on places.

Further, similar to the ninth embodiment, it is possible to apply an electric field across a lower waveguide or the separating layer 1305 and the light guide layer 1304. Thereby, the oscillation wavelength can be tuned.

This embodiment can also be applied to the third embodiment. In this case, no grating need to be formed.
Other embodiments In the above-discussed embodiments, material of GaAs/AlGaAs series is used, but the present invention can be applied to a semiconductor laser of InGaAsP/InP series or GaInP/AlGaInP series. The present invention can also be applied to a case where a so-called off-substrate whose crystal axis is deviated from a normal to the substrate plane by 0 to 5 degrees.

In the above embodiments, CBE is used as a regrowth method, but other appropriate methods can be used therefor. They are molecular beam epitaxy (MBE), metal organic molecular beam epitaxy (MOMBE) and gas source molecular beam epitaxy (GSMBE). Those methods can be distinguished from each other by configurations of materials and the like as follows:

| method | Group III material | Group V material | dopant |
|---|---|---|---|
| MBE | solid | solid | solid |
| MOMBE | organic metal | solid | solid |
| GSMBE | solid | gas | solid or gas |
| CBE | organic metal | gas | solid or gas |

As described in the foregoing, according to the present invention, an optical semiconductor device of a transverse current injection type or reverse bias application type can be fabricated without employing a diffusion process. Therefore, there are few limitations to the materials to be used in a device, and the degree of freedom in a process for fabricating an integrated optical device is greatly increased.

Further, according to the present invention, an optical semiconductor device of a transverse current injection type or reverse bias application type, whose resistance is small, can be readily fabricated without employing a diffusion process.

Further, according to the present invention, when an optical semiconductor device of a transverse current injection type or reverse bias application type is fabricated, a current block structure can be readily fabricated without strictly regulating etching conditions.

Further, according to the present invention, when an optical semiconductor device is fabricated, a two-layer light guide structure can be readily fabricated, in which a leak current path is narrowed with a transverse confinement structure for light being formed by a ridge burying structure.

While the present invention has been described with respect to what is presently considered to be the preferred embodiments, it is to be understood that the invention is not limited to the disclosed embodiments. The present invention is intended to cover various modifications and equivalent arrangements included within the spirit and scope of the following claims.

What is claimed is:

1. A method for producing an optical semiconductor device comprising the steps of:

forming a first type conductivity layer, a first main layer, which has any one of an undoped type, a first type conductivity and a second type conductivity, and a second type conductivity layer on a substrate in this order;

removing the layers down to at least the second type conductivity layer to form a ridge and forming at least one contact groove which reaches the first type conductivity layer, such that surfaces having different surface indices from a surface index of the substrate are exposed at the ridge and the contact groove;

performing a regrowth on the exposed surfaces using an amphi-conductivity impurity as a dopant, such that a first portion having a first type conductivity is grown on the contact groove and a second portion having a second type conductivity is grown on the ridge, the first type conductivity layer and the first portion acting as one of a first injection path of one of electrons and holes and first means for applying an electric field to the first main layer, and the second type conductivity layer and the second portion acting as one of a second injection path of the other of electrons and holes and second means for applying an electric field to the first main layer which cooperates with the first means to apply the electric field across the first main layer; and forming at least one transverse pn reverse junction portion for electrically separating one of the first injection path and the first means from one of the second injection path and the second means, during said regrowth performing step.

2. A method for producing an optical semiconductor device according to claim 1, further comprising a step of forming a second main layer which has any one of an undoped type, a first type conductivity and a second type conductivity, the second main layer being electrically separated from the first main layer by the first type conductivity layer, and a step of forming, on the other side of the substrate, third means for applying an electric field to the second main layer, cooperating with one of the first, means and the second means to apply the electric field across the second main layer.

3. A method for producing an optical semiconductor device according to claim 1, wherein the first portion, the second portion and the transverse pn reverse junction portion are respectively made by forming the ridge, the contact groove and an etched groove such that the surfaces having different surface indices are exposed, and performing the regrowth by any one of molecular beam epitaxy, chemical beam epitaxy, metal organic molecular beam epitaxy and gas source molecular beam epitaxy using an amphi-conductivity impurity as a dopant.

4. A method for producing an optical semiconductor device according to claim 1, wherein the substrate has a surface index of {001} or a surface index in the vicinity of {001}, and the ridge and the grooves are formed such that an exposed side surface of the ridge has a surface index of {111}A or a surface index in the vicinity of {111}A.

5. A method for producing an optical semiconductor device according to claim 1, wherein the substrate has a surface index of {111}A or a surface index in the vicinity of {111}A, and the ridge and the grooves are formed such that an exposed side surface of the ridge has a surface index of {001} or a surface index in the vicinity of {001}.

6. A method for producing an optical semiconductor device according to claim 1, wherein the substrate has a surface index of {001}A, and the ridge and the grooves are formed such that exposed slanting surfaces of the ridge and the grooves have inclination angles from about 25 degrees from a {001} surface to about 54 degrees from a {001} surface.

7. A method for producing an optical semiconductor device according to claim 1, wherein the substrate has a surface index of {111}, and the ridge and the grooves are formed such that exposed slanting surfaces of the ridge and the grooves have inclination angles from about 25 degrees from a {111} surface to about 54 degrees from a {111} surface.

8. A method for producing an optical semiconductor device according to claim 1, wherein the ridge and the grooves are formed by forming a stripe-shaped resist pattern having openings of different widths on epitaxial layers, and performing a wet etching using the resist pattern as a mask.

9. A method for producing an optical semiconductor device according to claim 1, wherein the ridge and the grooves are formed by a single etching process.

10. A method for producing an optical semiconductor device according to claim 1, wherein the substrate has a surface index of {001} or a surface index in the vicinity of {001}, the ridge and the grooves extending in a <1$\bar{1}$0> direction are formed such that the exposed slanting surface has a surface index which is inclined 25 degrees to 54 degrees from the surface index of {001}, and the regrowth is performed by any one of molecular beam epitaxy, chemical beam epitaxy, metal organic molecular beam epitaxy and gas source molecular beam epitaxy using an amphi-conductivity impurity as a dopant, such that a portion of regrown layers becomes an n-type layer which constitutes one of the first portion and the second portion and another portion of the regrown layers becomes a p-type layer which constitutes the other of the first portion and the second portion.

11. A method for producing an optical semiconductor device according to claim 1, wherein the substrate has a surface index of {111}A or a surface index in the vicinity of {111}A, the ridge and the grooves extending in a <1$\bar{1}$0> direction are formed such that the exposed slanting surface has a surface index which is inclined 25 degrees to 54 degrees from the surface index of {111}, and the regrowth is performed by any one of molecular beam epitaxy, chemical beam epitaxy, metal organic molecular beam epitaxy and gas source molecular beam epitaxy using an amphi-conductivity impurity as a dopant, such that a portion of regrown layers becomes an n-type layer which constitutes one of the first portion and the second portion and another portion of the regrown layers becomes a p-type layer which constitutes the other of the first portion and the second portion.

12. A method for producing an optical semiconductor device according to claim 1, wherein the substrate has a surface index of {001} or a surface index in the vicinity of {001}, the ridge and grooves extending in a {1$\bar{1}$0} direction are formed such that the exposed slanting surface has a surface index which is inclined 25 degrees to 54 degrees from a surface index of {001}, and the regrowth is performed such that a transverse pnp junction portion, which constitutes the transverse pn reverse junction portion, is formed.

13. A method for producing an optical semiconductor device according to claim 1, wherein a plurality of the grooves are formed between the first portion and the second portion, and the regrowth is performed such that the transverse pn reverse junction portion is formed by an n-type layer and a p-type layer.

14. A method for producing an optical semiconductor device according to claim 1, wherein a plurality of the contact grooves are formed and the other first portion is grown on the contact grooves.

15. A method for producing an optical semiconductor device according to claim 1, wherein a plurality of the grooves are formed by etching between the first portion and the second portion, widths of opening portions formed at the grooves monotonically increase from the ridge, on which the second portion is formed, toward the contact groove, on which the first portion is formed, and a difference $\Delta w$ between the widths of the adjacent opening portions satisfies a relation of $\Delta w < 2D/\tan\theta$ where D is the thickness of the first main layer and $\theta$ is an angle between said substrate and a side surface of the ridge or a slanting surface of the grooves exposed by the etching.

16. A method for producing an optical semiconductor device comprising the steps of:

forming a first type conductivity layer, a first main layer, which has any one of an undoped type, a first type conductivity and a second type conductivity, and a second type conductivity layer on a substrate in this order;

forming a contact groove by etching said formed layers down to said first type conductivity layer;

forming a ridge by making etched grooves extending down to at least said first main layer in both sides of a portion in which said ridge is formed, wherein a cross section of one of said etched grooves for forming said ridge, which is nearer to said contact groove, has a reverse trapezoid shape, and said etched groove has a bottom surface and slanting surfaces in both sides of the bottom surface and the other of said etched grooves has at least a slanting surface, and a cross section of said ridge has a trapezoid shape and said ridge has an upper surface and slanting surfaces in both sides of the upper surface, and one of the slanting surfaces of said etched groove nearer to said contact groove and one of the slanting surfaces of said ridge are the same surface, and the slanting surface of said other etched groove and the other slanting surface of said ridge are the same surface; and performing a regrowth on said ridge, etched grooves and contact groove using an amphi-conductivity impurity as a dopant, so that a first type conductivity portion is grown on at least a portion, extending down to the first type conductivity layer, of the contact groove, and the slanting surfaces of the etched grooves and the ridge, and a second type conductivity portion is grown on the upper surface of the ridge and the bottom surface of the etched groove, wherein said first type conductivity layer and a first portion of the first type conductivity portion grown on the portion, extending down to the first type conductivity layer, of the contact groove act as one of a first injection path of one of electrons and holes and first means for applying an electric field to the first main layer, and said second type conductivity layer and a second portion of the second type conductivity portion grown on the upper surface of the ridge act as one of a second injection path of one of electrons and holes and second means for applying an electric field to the first main layer which cooperates with the first means to apply the electric field across the first main layer.

17. A method for producing an optical semiconductor device according to claim 16, further comprising a step of forming a second main layer which has any one of an undoped type, a first type conductivity and a second type conductivity, the second main layer being electrically separated from the first main layer by the first type conductivity layer, and a step of forming, on the other side of the substrate, third means for applying an electric field to the second main layer, cooperating with one of the first means and the second means to apply the electric field across the second main layer.

18. A method for producing an optical semiconductor device according to claim 16, wherein said first type conductivity portion and said second type conductivity portion are made by forming said contact groove so that the portion, extending down to the first type conductivity layer, of the contact groove has a surface on which the regrowth of a first type conductivity layer is performed using an amphi-conductivity impurity as a dopant, forming the etched grooves so that slanting surfaces thereof will be surfaces on which the regrowth of a first type conductivity layer is performed using an amphi-conductivity impurity as a dopant and the bottom thereof will be a surface on which the regrowth of a second type conductivity layer is performed using an amphi-conductivity impurity as a dopant, forming the ridge so that the upper surface thereof will be a surface on which the regrowth of a second type conductivity layer is performed using an amphi-conductivity impurity as a dopant, and performing the regrowth by any one of molecular beam epitaxy, chemical beam epitaxy, metal organic molecular beam epitaxy and gas source molecular beam epitaxy using an amphi-conductivity impurity as a dopant.

19. A method for producing an optical semiconductor device according to claim 16, wherein said contact groove, etched grooves and ridge are formed so that the bottom surface of the etched groove and the upper surface of the ridge have a surface index of {001} or a surface index in the vicinity of {001}, and so that the portion, extending down to the first type conductivity layer, of the contact groove and the slanting surfaces of the etched grooves and ridge have a surface index {111}A or a surface index in the vicinity of {111}A.

20. A method for producing an optical semiconductor device according to claim 16, wherein said contact groove, etched grooves and ridge are formed so that the bottom surface of the etched groove and the upper surface of the ridge have a surface index of {111}A or a surface index in the vicinity of {111}A, and so that the portion, extending down to the first type conductivity layer, of the contact groove and the slanting surfaces of the etched grooves and ridge have a surface index of {001} or a surface index in the vicinity of {001}.

21. A method for producing an optical semiconductor device according to claim 16, wherein said contact groove, etched grooves and ridge are formed so that the bottom surface of the etched groove and the upper surface of the ridge have a surface index of {001} or a surface index in the vicinity of {001}, and so that the portion of the contact grooves extending down to the first type conductivity layer and the slanting surfaces of the etched grooves and ridge have inclination angles from about 25 degrees from a {001} surface to about 54 degrees from a {001} surface.

22. A method for producing an optical semiconductor device according to claim 16, wherein said contact grooves, etched grooves and ridge are formed so that the bottom surface of the etched groove and the upper surface of the ridge have a surface index of {111}A or a surface index in the vicinity of {111}A, and so that the portion, extending down to the first type conductivity layer, of the contact groove and the slanting surfaces of the etched grooves and ridge have inclination angles from about 25 degrees from a {111}A surface to about 54 degrees from {111}A surface.

23. A method for producing an optical semiconductor device according to claim 16, wherein the ridge and the grooves are formed by forming a stripe-shaped resist pattern having openings of different widths on epitaxial layers, and performing a wet etching using the resist pattern as a mask.

24. A method for producing an optical semiconductor device according to claim 16, wherein the ridge and the grooves are formed by a single etching process.

25. A method for producing an optical semiconductor device according to claim 16, wherein a plurality of the contact grooves are formed and the first portion is grown on the contact grooves.

26. A method for producing an optical semiconductor device comprising the steps of:
    forming a) a first type conductivity layer, b) a first main layer, which has any one of an undoped type, a first type conductivity and a second type conductivity, and c) a second type conductivity layer on a substrate in this order;
    forming a contact groove by etching said formed layers down to said first type conductivity layer;
    forming a ridge by making two etched grooves extending down to at least said first main layer in both sides of a portion in which said ridge is formed,
    wherein a surface on which a first type conductivity portion is grown by performing a growth using an amphi-conductivity impurity as a dopant, is exposed on side portions of the ridge formed by said two etched grooves and a portion, extending down to the first type conductivity layer of the contact groove, and a surface on which a second type conductivity portion is grown by performing a growth using an amphi-conductivity impurity as a dopant is exposed on at least one portion between the contact groove and the ridge and an upper portion of the ridge,
    performing a regrowth using an amphi-conductivity impurity as a dopant, so that the first type conductivity portion is grown on the portion extending down to the first type conductivity layer of the contact groove and the side portions of the ridge, and a second type conductivity portion is grown on at least the one portion between the contact groove and the ridge and the upper portion of the ridge,
    wherein said first type conductivity layer and the portion extending down to the first type conductivity layer of the contact groove act as one of a first injection path of one of electrons and holes and first means for applying an electric field to the first main layer, and said second type conductivity layer and the second type conductivity portion grown on the upper portion of the ridge act as one of a second injection path of one of electrons and holes and second means for applying an electric field to the first main layer which cooperates with the first means to apply the electric field across the first main layer.

27. A method for producing an optical semiconductor device according to claim 26, further comprising a step of forming a second main layer which has any one of an undoped type, a first type conductivity and a second type conductivity, the second main layer being electrically separated from the first main layer by the first type conductivity layer, and a step of forming, on the other side of the substrate, third means for applying an electric field to the second main layer, cooperating with one of the first means and the second means to apply the electric field across the second main layer.

28. A method for producing an optical semiconductor device according to claim 26, wherein a surface having a surface index of {001} or a surface index in the vicinity of {001} is exposed on at least the one portion between the contact groove and the ridge and the upper portion of the ridge, and a surface having a surface index of {111}A or a surface index in the vicinity of {111}A is exposed on side portions of the ridge and the portion extending down to the first type conductivity layer, of the contact groove.

29. A method for producing an optical semiconductor device according to claim 26, wherein a surface having a surface index of {111}A or a surface index in the vicinity of {111}A is exposed on at least the one portion between the contact groove and the ridge and the upper portion of the ridge, and a surface having a surface index of {001} or a surface index in the vicinity of {001} is exposed on the side portions of the ridge and the portion extending down to the first type conductivity layer, of the contact groove.

30. A method for producing an optical semiconductor device according to claim 26, wherein a surface having a surface index of {001} or a surface index in the vicinity of {001} is exposed on at least one portion between the contact groove and the ridge and the upper portion of the ridge, and a surface having inclination angles from about 25 degrees from a {001} surface to about 54 .degrees from a {001} surface is exposed on the side portions of the ridge and the portion, extending down to the first type conductivity layer, of the contact groove.

31. A method for producing an optical semiconductor device according to claim 26, wherein a surface having a surface index of {111}A or a surface index in the vicinity of {111}A is exposed on at least the one portion between the contact groove and the ridge and the upper portion the ridge, and a surface having inclination angles about 25 degrees from a {111}A surface to about 54 degrees from a {111}A surface is exposed on the side portions of the ridge and the portion, extending down to the first type conductivity layer, of the contact groove.

32. A method for producing an optical semiconductor device according to claim 26, wherein the ridge and the grooves are formed by forming a stripe-shaped resist pattern having openings of different widths on epitaxial layers, and performing a wet etching using the resist pattern as a mask.

33. A method for producing an optical semiconductor device according to claim 26, wherein the ridge and the grooves are formed by a single etching process.

34. A method for producing an optical semiconductor device according to claim 26, wherein a plurality of the contact grooves are formed and the portion extending down to the first type conductivity layer is grown on the contact grooves.

* * * * *

UNITED STATES PATENT AND TRADEMARK OFFICE
CERTIFICATE OF CORRECTION

PATENT NO. : 5,728,605

DATED : March 17, 1998

INVENTOR(S) : NATSUHIKO MIZUTANI

Page 1 of 3

It is certified that error appears in the above-identified patent and that said Letters Patent is hereby corrected as shown below:

On the title page, item

[56] REFERENCES CITED

OTHER PUBLICATIONS

Page 2, "dpendence" should read --dependence--.

COLUMN 1

Line 29, "a" (second occurrence) should be deleted;
Line 45, "averaged" should read --average--; and
Line 59, "as a" should read --as an--.

COLUMN 5

Line 44, "[1" should be deleted; and
Line 45, "$\bar{1}0$]" should read --[1$\bar{1}$0]--.

COLUMN 6

Line 62, "[1" should be deleted; and
Line 63, "$\bar{1}0$]" should read --[1$\bar{1}$0]--.

UNITED STATES PATENT AND TRADEMARK OFFICE
CERTIFICATE OF CORRECTION

PATENT NO. : 5,728,605

DATED : March 17, 1998

INVENTOR(S) : NATSUHIKO MIZUTANI

Page 2 of 3

It is certified that error appears in the above-identified patent and that said Letters Patent is hereby corrected as shown below:

COLUMN 11

Line 19, "dr" should read --$d_r$--.

COLUMN 13

Line 1, "controlling" should read --control--; and
Line 30, "$w_1$-$W_7$" should read --$w_1$-$w_7$--.

COLUMN 14

Line 41, "will he" should read --will be--.

COLUMN 15

Line 41, "[1" should be deleted;
Line 42, "$\bar{1}$0]" should read --[1$\bar{1}$0]--; and
Line 44, "is" should read --are--.

COLUMN 16

Line 36, "[110]" should read --[1$\bar{1}$0]--;
Line 38, "[$\bar{1}$01," should read --[$\bar{1}$01],--;
Line 66, "[1" should be deleted; and
Line 67, "$\bar{1}$0]" should read --[1$\bar{1}$0]--.

UNITED STATES PATENT AND TRADEMARK OFFICE
CERTIFICATE OF CORRECTION

PATENT NO. : 5,728,605
DATED : March 17, 1998
INVENTOR(S) : NATSUHIKO MIZUTANI

It is certified that error appears in the above-identified patent and that said Letters Patent is hereby corrected as shown below:

COLUMN 21

Line 53, "first," should read --first--.

COLUMN 22

Line 20, "{111}," should read --{111}A,--;
    Line 23, "{111}" (both occurrences) should read --{111}A--; and
    Line 55, "{111}," should read --{111}A,--.

COLUMN 26

Line 39, ".degrees" should read --degrees--; and
    Line 47, "portion the" should read --portion of the--.

Signed and Sealed this

Twenty-second Day of December, 1998

Attest:

BRUCE LEHMAN

*Attesting Officer*      *Commissioner of Patents and Trademarks*